US012720807B2

(12) United States Patent

Lai et al.

(10) Patent No.: US 12,720,807 B2

(45) Date of Patent: Aug. 25, 2026

(54) GATE DIELECTRIC LAYERS FOR STACKED MULTI-GATE DEVICE

(71) Applicant: Taiwan Semiconductor Manufacturing Company, Ltd., Hsinchu (TW)

(72) Inventors: Te-Yang Lai, Hsinchu (TW); Yen-Fu Chen, Taipei (TW); Shu-Han Chen, Hsinchu City (TW); Tsung-Da Lin, Hsinchu (TW); Da-Yuan Lee, Hsinchu County (TW); Chi On Chui, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 460 days.

(21) Appl. No.: 18/355,688

(22) Filed: Jul. 20, 2023

(65) Prior Publication Data

US 2024/0313076 A1 Sep. 19, 2024

Related U.S. Application Data

(60) Provisional application No. 63/490,460, filed on Mar. 15, 2023.

(51) Int. Cl.

*H01L 29/423* (2006.01)

*H01L 21/8238* (2006.01)

(Continued)

(52) U.S. Cl.

CPC ....... *H10D 30/6735* (2025.01); *H10D 30/014* (2025.01); *H10D 30/43* (2025.01); (Continued)

(58) Field of Classification Search

CPC .. H10D 30/6735; H10D 30/014; H10D 30/43; H10D 30/6757; H10D 62/121; (Continued)

(56) References Cited

U.S. PATENT DOCUMENTS

2017/0256544 A1* 9/2017 Chai .................. H10D 84/0135

2020/0083114 A1* 3/2020 Chen .................... H10D 64/681

(Continued)

FOREIGN PATENT DOCUMENTS

CN 115579361 A 1/2023

CN 115732548 A 3/2023

CN 115799319 A 3/2023

*Primary Examiner* — Tong-Ho Kim

(74) *Attorney, Agent, or Firm* — HAYNES AND BOONE, LLP

(57) ABSTRACT

Semiconductor structures and methods are provided. An example method includes receiving a workpiece that includes a substrate, first channel members over a first region of the substrate, second channel members over a second region of the substrate, and third channel members over a third region of the substrate, depositing a first gate dielectric layer to wrap around each of the first channel members, each of the second channel members, and each of the third channel members, selectively depositing a first dipole layer to wrap around each of the third channel members, performing a first anneal process to drive a first dopant in the first dipole layer into the first gate dielectric layer around the third channel members, removing the first dipole layer, and after the removing, depositing a second gate dielectric layer to wrap around the first channel members, the second channel members, and the third channel members.

20 Claims, 19 Drawing Sheets

(51) Int. Cl.
*H01L 27/092* (2006.01)
*H01L 29/06* (2006.01)
*H01L 29/66* (2006.01)
*H01L 29/775* (2006.01)
*H01L 29/786* (2006.01)
*H10D 30/01* (2025.01)
*H10D 30/43* (2025.01)
*H10D 30/67* (2025.01)
*H10D 62/10* (2025.01)
*H10D 84/01* (2025.01)
*H10D 84/03* (2025.01)
*H10D 84/85* (2025.01)

(52) U.S. Cl.
CPC ....... *H10D 30/6757* (2025.01); *H10D 62/121* (2025.01); *H10D 84/0167* (2025.01); *H10D 84/038* (2025.01); *H10D 84/85* (2025.01)

(58) Field of Classification Search
CPC .. H10D 84/0167; H10D 84/038; H10D 84/85; H10D 64/685; H10D 84/83
USPC .......................................................... 257/288
See application file for complete search history.

(56) References Cited

U.S. PATENT DOCUMENTS

| | | | | |
|---|---|---|---|---|
| 2021/0366783 | A1* | 11/2021 | Chu | H10D 64/01 |
| 2021/0366907 | A1 | 11/2021 | Liao | |
| 2022/0037528 | A1 | 2/2022 | Chuang | |
| 2022/0216340 | A1 | 7/2022 | Lin | |
| 2022/0320293 | A1* | 10/2022 | Liao | H10D 64/685 |
| 2023/0073078 | A1* | 3/2023 | Rachmady | H10D 84/83 |

* cited by examiner

200
TD1 TD2 TD3
2080T
2080B
2080
270
230T
258
256
254
230B
20
10
250 246 242
250 2460 2420
250 2460 242
206
202
BD1 BD2 BD3
D1 D2 D3

GATE DIELECTRIC LAYERS FOR STACKED MULTI-GATE DEVICE

PRIORITY DATA

This application claims priority to U.S. Provisional Patent Application No. 63/490,460, filed on Mar. 15, 2023, which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures.

As the semiconductor industry further progresses into advanced technology process nodes in pursuit of higher device density, higher performance, and lower costs, challenges from both fabrication and design issues have led to stacked device structure configurations, such as complementary field effect transistors (C-FET) where an n-type multi-gate transistor and a p-type multi-gate transistor are stacked vertically, one over the other.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
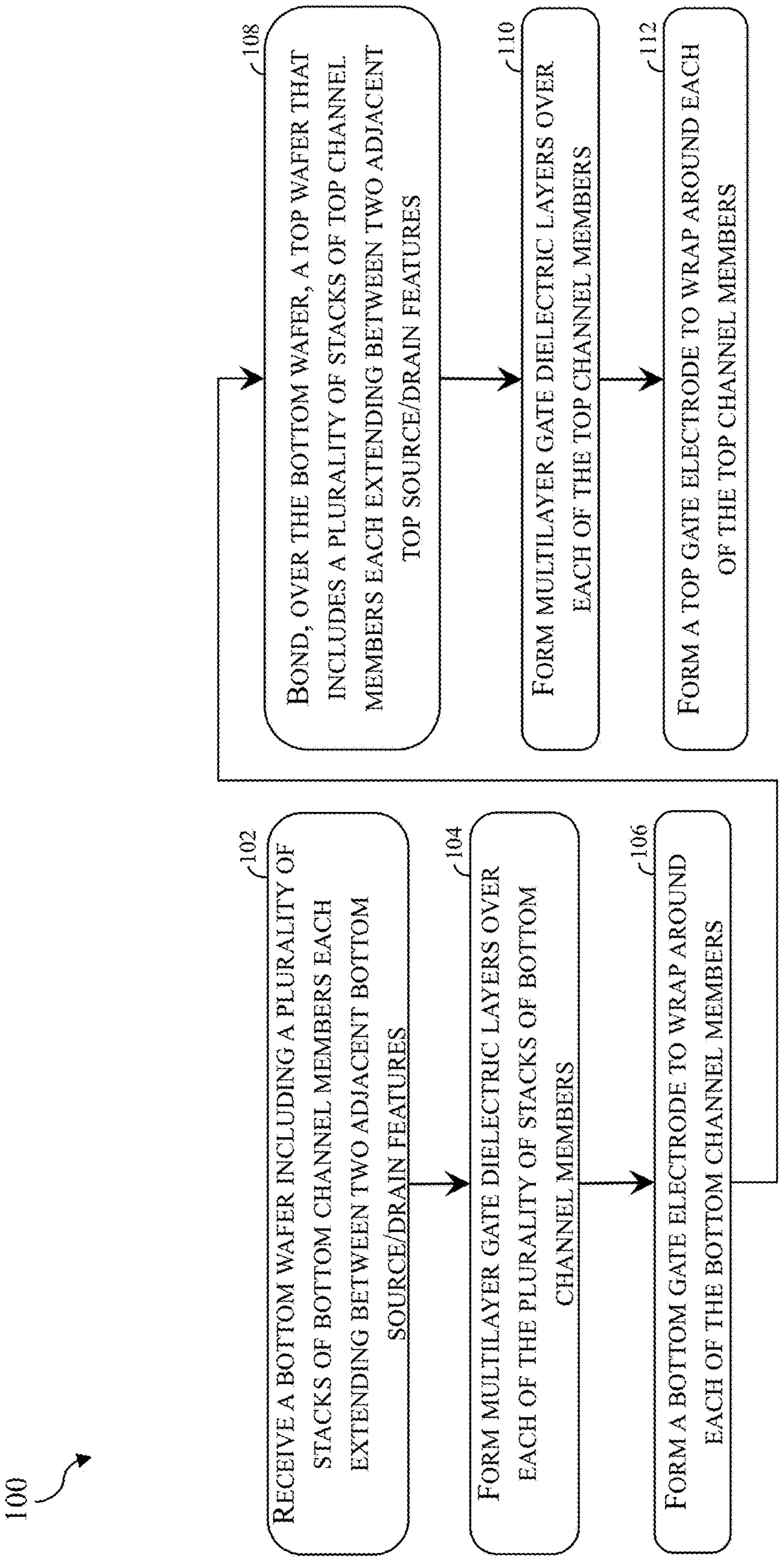
FIG. 1 illustrates a flow chart of a method 100 for forming C-FET structure, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

Metal gate stacking and dipole layer doping processes may be used when design of the circuit calls for devices with multiple threshold voltage. Fabrication of C-FET requires forming gate structure in high-aspect ratio openings and restricted spaces. The space restriction makes it challenging to stack different work function layers and to deposit and remove dipole layers. To further diversify device threshold voltage, multiple dipole layer deposition steps may be needed. The restricted space once again stands in the way. Because multiple dipole layer doping processes may require multiple etch back operations, damages to or loss of gate dielectric layers are another concern.

The present disclosure provides a simplified and well-controlled integrated flow to form gate structures with different threshold voltages. According to the present disclosure, a method to form multilayer gate dielectric layers to achieve different threshold voltages includes multiple loops. Each of the loops includes forming a dipole layer over a gate dielectric layer, selectively removing the dipole layer from certain regions, performing an anneal to diffuse dopants in the dipole layer into the gate dielectric layer, removing excess dipole layer, and depositing a fresh gate dielectric layer. Methods of the present disclosure provide several benefits. They reduce cost of fabrication by reducing the number of photolithography and patterning process. By allowing multiple drive-in anneal processes, they provide more diverse threshold voltage offering. By depositing a fresh gate dielectric layer at the end of each loop, they counteract negative effects associated with loss or damages to the gate dielectric layer.

The various aspects of the present disclosure will now be described in more detail with reference to the figures. In that regard, FIG. 1 is a flowchart illustrating method 100 of forming a C-FET structure from a workpiece. FIG. 10 is a flowchart illustrating method 300 of forming multilayer gate dielectric layers. Aspects of method 100 in FIG. 1 involve implementation of method 300 in FIG. 10. Methods 100 and 300 are merely examples and are not intended to limit the present disclosure to what is explicitly illustrated in method 100 or method 300. Additional steps can be provided before, during and after the method 100 or method 300 and some steps described can be replaced, eliminated, or moved around for additional embodiments of the methods. Not all steps are described herein in detail for reasons of simplicity. Method 100 is described below in conjunction with FIGS. 1-9, which are fragmentary cross-sectional views of a workpiece 200 at different stages of fabrication according to embodiments of method 100. Method 300 is described below in conjunction with FIGS. 11-19, which are fragmentary cross-sectional views of stacks of channel members at different stages of fabrication according to embodiments of method 300. For avoidance of doubts, throughout the figures, the X direction is perpendicular to the Y direction and the Z direction is perpendicular to both the X direction and the Y direction. It is noted that, because the workpiece 200 may be fabricated into a semiconductor device, the workpiece 200 may be referred to as the semiconductor device 200 as the context requires. Throughout the present disclosure, similar reference numerals in the present disclosure denote similar features.

Figure 2:
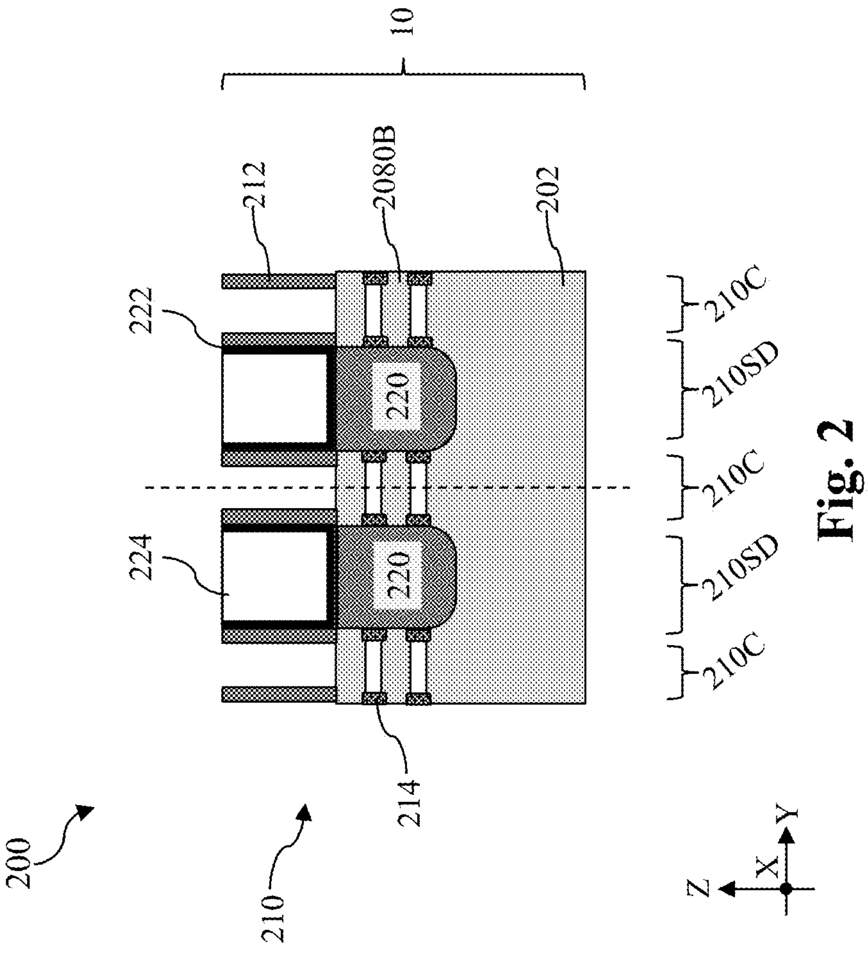
FIGS. 2-9 illustrate fragmentary cross-sectional views of a workpiece during a fabrication process according to the method 100 of FIG. 1, according to one or more aspects of the present disclosure.
Figure 3:
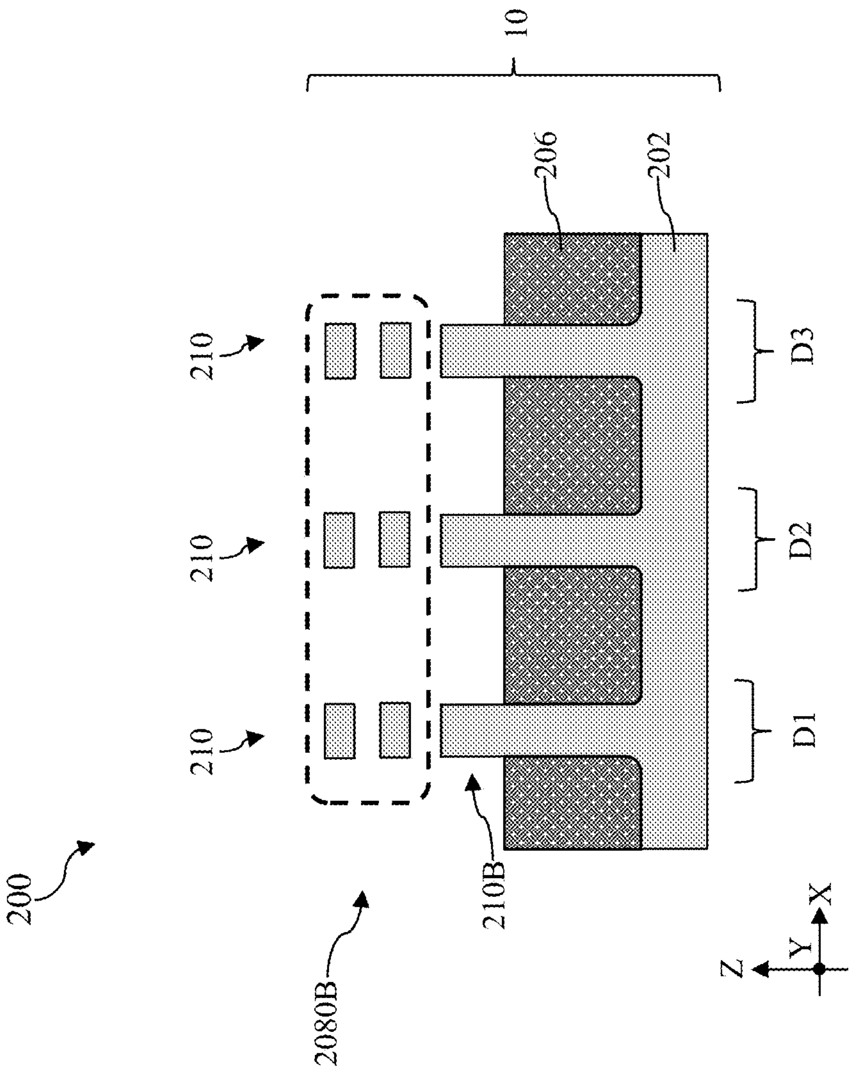

Referring to FIGS. 1, 2 and 3, method 100 includes a block 102 where a workpiece 200 is provided. The workpiece 200 includes a bottom wafer 10. As shown in FIG. 2, the bottom wafer 10 includes a substrate 202, an active region 210 disposed over the substrate 202. In one embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The active region 210 may have a fin-like shape and extend lengthwise along the Y direction. Along the Y direction, the active region 210 includes a plurality of channel regions 210C interleaved by a plurality of source/drain regions 210SD.

While not explicitly shown in FIG. 2, the active region 210 is patterned from a stack that includes a plurality of channel layers interleaved by a plurality of sacrificial layers. The channel layers and the sacrificial layers may have different semiconductor compositions. In one embodiment, the channel layers are formed of silicon (Si) and sacrificial layers are formed of silicon germanium (SiGe). In these implementations, the additional germanium content in the sacrificial layers allow selective removal or recess of the sacrificial layers without substantial damages to the channel layers. In FIG. 2, the sacrificial layers over the channel regions 210C have been selectively removed to release the channel layers as bottom channel members 2080B. Along the Y direction, each of the bottom channel members 2080B extend between two bottom source/drain features 220 disposed over source/drain regions 210SD. Before formation of the bottom source/drain features 220, the source/drain regions 210SD of the active region 210 are recessed when the channel regions 210C are covered by polysilicon dummy gate stacks (removed in FIG. 2) and gate spacers 212. The recessing of the source/drain regions 210SD form source/drain trenches that expose sidewalls of the channel layers and sacrificial layers. In some embodiments shown in FIG. 2, sidewalls of the sacrificial layers may be selectively recessed to form inner spacer recesses that are later filled with inner spacer features 214. As shown in FIG. 2, the inner spacer features 214 vertically interleave the released bottom channel members 2080B. As will be shown in FIG. 4, the inner spacer features 214 function to isolate a bottom gate electrode 230B and the bottom source/drain features 220.

Reference is still made to FIG. 2. In some embodiments, the gate spacers 212 and inner spacer features 214 may include silicon nitride, silicon oxynitride, silicon carbonitride, silicon oxycarbide, silicon oxycarbonitride, and/or combinations thereof. The bottom source/drain features 220 may be formed using an epitaxial process, such as vapor phase epitaxy (VPE), ultra-high-vacuum chemical vapor deposition (UHV-CVD), molecular beam epitaxy (MBE), and/or other suitable processes. The epitaxial growth process may use gaseous and/or liquid precursors, which interact with the composition of the substrate 202 as well as sidewalls of the bottom channel members 2080B. The bottom source/drain features 220 are therefore coupled to sidewalls of the bottom channel members 2080B. The bottom source/drain features 220 may be n-type or p-type. When they are n-type, they may include silicon (Si) doped with an n-type dopant, such as phosphorus (P), arsenic (As). When they are p-type, they may include silicon germanium (SiGe) doped with a p-type dopant, such as boron (B). In one embodiment, the bottom source/drain features 220 are p-type and include boron-doped silicon germanium (SiGe:B). In some implementations represented in FIG. 2, portions of the bottom source/drain features 220 may extend into the substrate 202.

As shown in FIG. 2, the bottom wafer 10 may include a bottom contact etch stop layer (CESL) 222 disposed along top surfaces of bottom source/drain features 220 as well as sidewalls of the gate spacers 212. A bottom interlayer dielectric (ILD) layer 224 is deposited over the bottom CESL 222. The bottom CESL 222 may include silicon nitride, silicon oxynitride, and/or other materials known in the art and may be formed by ALD, plasma-enhanced chemical vapor deposition (PECVD) process and/or other suitable deposition or oxidation processes. The bottom ILD layer 224 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. After the formation of the bottom CESL 222 and the bottom ILD layer 224, the bottom wafer 10 is planarized to expose the polysilicon dummy gate stacks. The polysilicon dummy gate stacks are then selectively removed. Thereafter, the sacrificial layers are selectively removed to release the channel layers as the bottom channel members 2080B, as illustrated in FIG. 2.

FIG. 3 illustrates a Y-direction fragmentary cross-sectional view that cuts through a channel region 210C. The bottom wafer 10 may include multiple device regions. In some embodiments represented in FIG. 3, the bottom wafer 10 includes three device regions—a first device region D1, a second device region D2, and a third device region D3. For illustration purposes, each of the device regions in FIG. 3 includes a single active region 210 that includes a vertical stack of bottom channel members 2080B stacked over a base fin 210B. However, the present disclosure is not limited. It should be understood that each of the device regions may include more than one active regions 210. Additionally, while the first device region D1, the second device region D2 and the third device region D3 are depicted as being disposed next to one another, they may be spaced apart from one another by isolation structures or other devices. In some implementations, the active regions 210 extend parallel to one another along the Y direction and are spaced apart from one another along the X direction by an isolation feature 206. In some instances, the isolation feature 206 may include silicon oxide, silicon oxynitride, fluorine-doped silicate glass (FSG), a low-k dielectric, combinations thereof, and/or other suitable materials.

Figure 4:
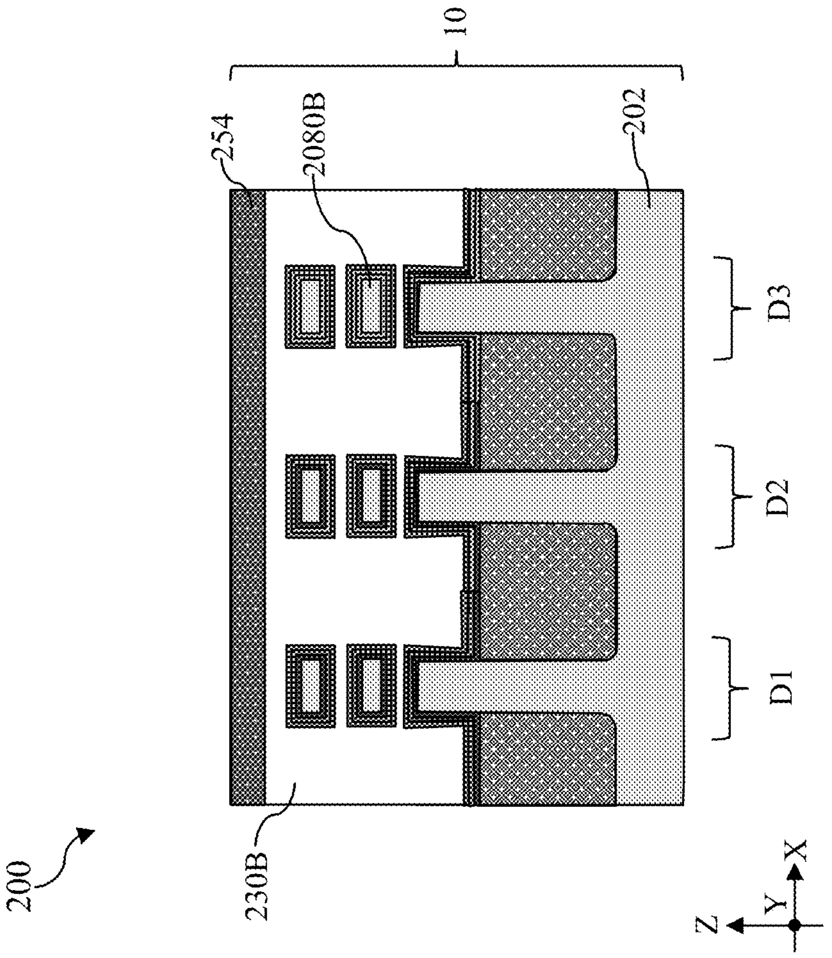

Referring to FIGS. 1 and 4, method 100 includes a block 104 where multilayer gate dielectric layers are formed over each of the plurality of stacks of bottom channel members 2080B. Block 104 includes implementation of method 300 illustrated in FIG. 10 to the bottom channel members 2080B in the first device region D1, the second device region D2 and the third device region D3 shown in FIG. 3. Because performance of method 300 to the bottom channel members 2080B largely accounts for the operations at block 104 of method 100, the description now proceeds to method 300.

Figure 10:
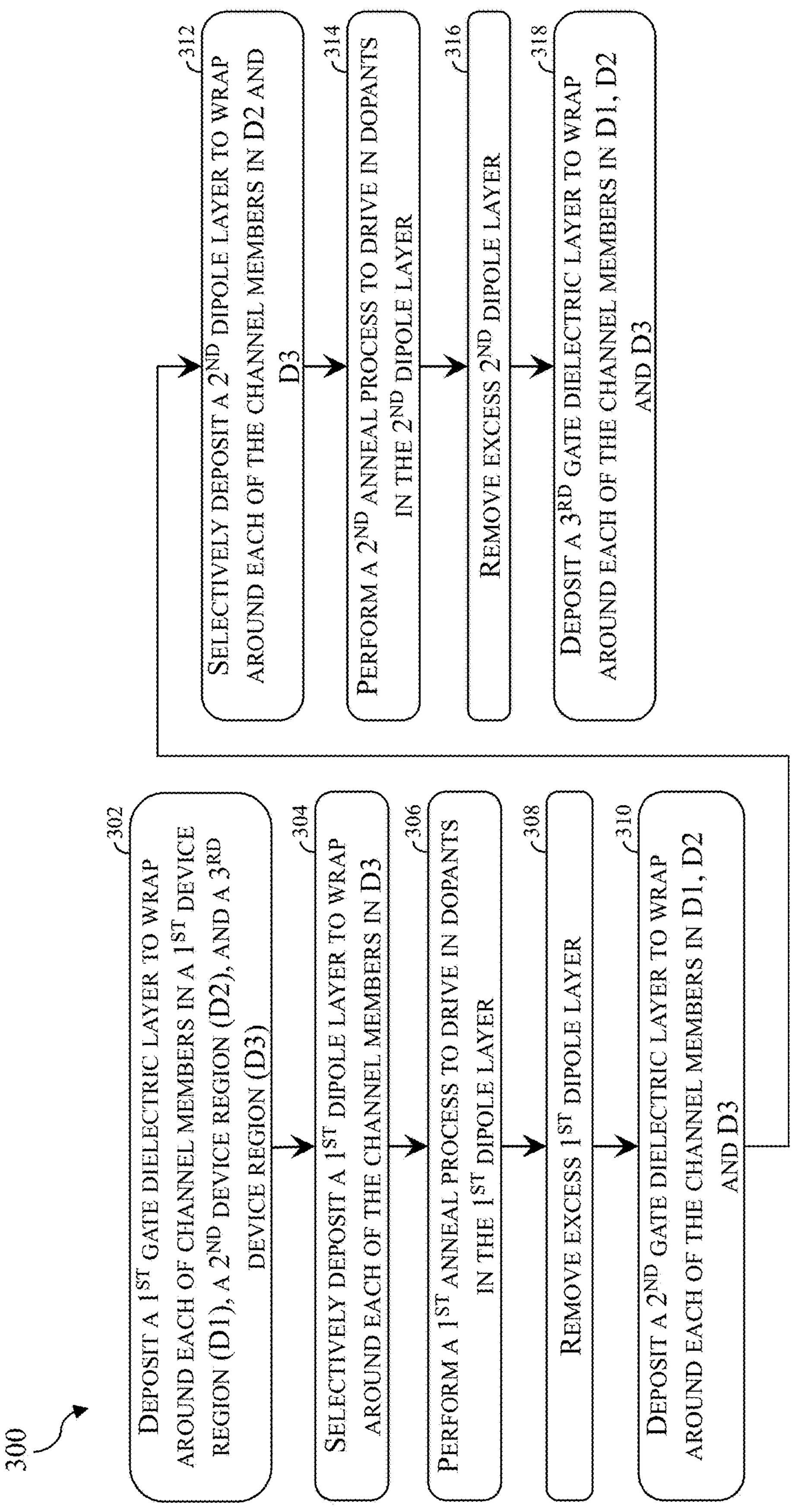
FIG. 10 illustrates a flow chart of a method 300 for forming multi-layer gate dielectric layers, according to one or more aspects of the present disclosure.
Figure 11:
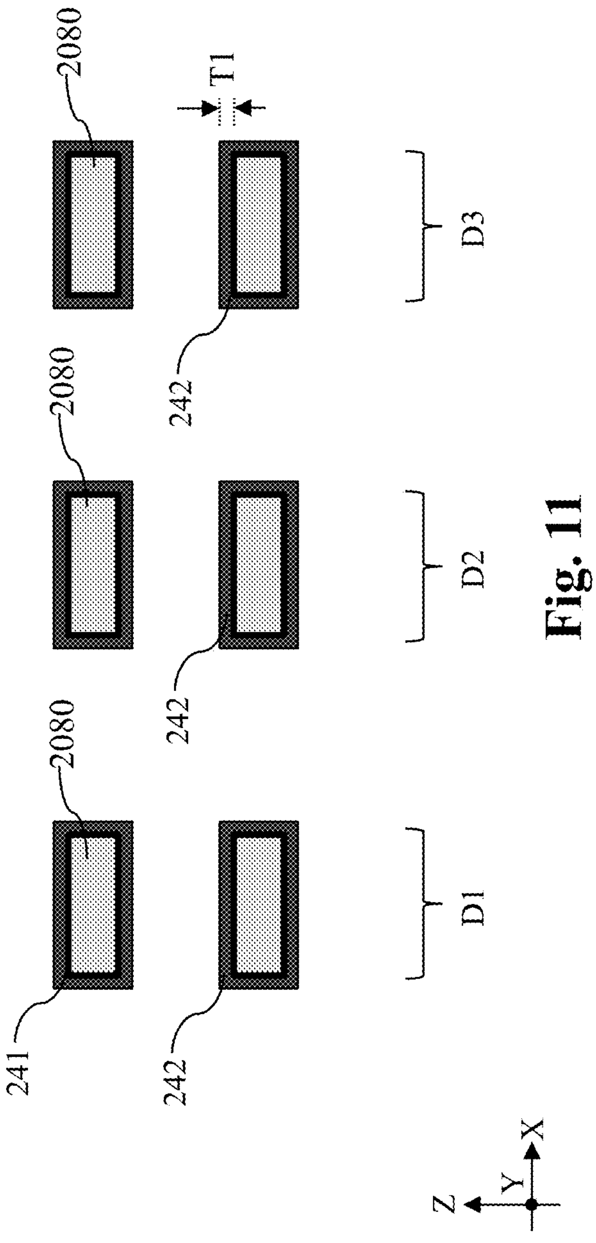
FIGS. 11-19 illustrates illustrate fragmentary cross-sectional views of stacks of channel members during a fabrication process according to the method 300 of FIG. 10, according to one or more aspects of the present disclosure.

Referring to FIGS. 10 and 11, method 300 includes a block 302 where a first gate dielectric layer 242 is deposited over each of the channel members 2080 in the first device region D1, each of the channel members 2080 in the second device region D2, and each of the channel members 2080 in the third device region D3. Because method 300 is performed to both the bottom channel members 2080B described above and top channel members 2080T to be described below with respect to block 110, the channel members 2080 shown in FIGS. 11-19 may refer to the bottom channel members 2080B when method 300 is performed at block 104 or top channel members 2080T when method 300 is performed at block 110.

In some embodiments illustrated in FIG. 11, an interfacial layer 241 may be formed on exposed surfaces of the channel members 2080 in the first device region D1, the second device region D2 and the third device region D3. The interfacial layer 241 includes silicon oxide and may be formed in a pre-clean process. An example pre-clean process may include use of RCA SC-1 (ammonia, hydrogen peroxide and water) and/or RCA SC-2 (hydrochloric acid, hydrogen peroxide and water). The first gate dielectric layer 242 may include a high dielectric constant (or high-k) dielectric material, such as hafnium oxide, hafnium zirconium oxide, zirconium oxide, or a combination thereof. In one embodiment, the first gate dielectric layer 242 includes hafnium oxide. The first gate dielectric layer 242 may be deposited using ALD or plasma-enhanced ALD (PEALD). As deposited, the first gate dielectric layer 242 may include a first thickness T1 between about 30 Å and about 50 Å. As shown in FIG. 11, the interfacial layer 241 is in direct contact with a top surface, side surfaces and a bottom surfaces of each of the channel members 2080. The first gate dielectric layer 242 is disposed over and in contact with the interfacial layer 241.

Figure 12:
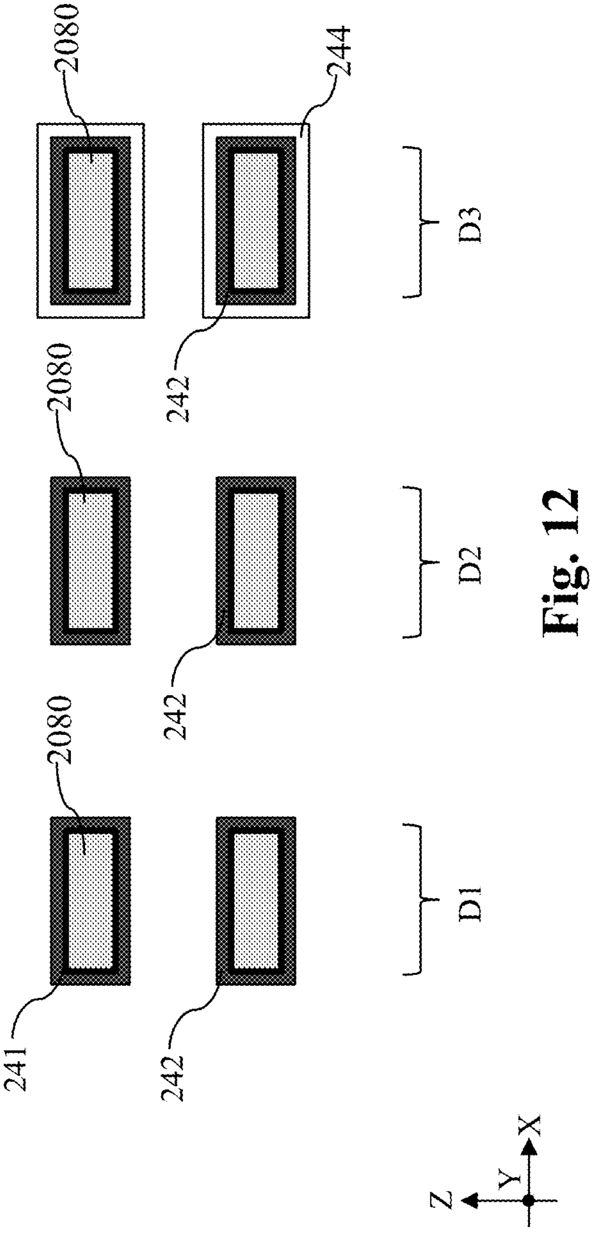

Referring to FIGS. 10 and 12, method 300 includes a block 304 where a first dipole layer 244 is selectively deposited to wrap around each of the channel members in the third device region D3. The first dipole layer 244 may be a metal oxide, a metal nitride, or a metal alloy that includes lanthanum (La), aluminum (Al), magnesium (Mg), indium (In), gallium (Ga), titanium (Ti), zirconium (Zr), gadolinium (Gd), yttrium (Y), zinc (Zn), or niobium (Nb). For example, the first dipole layer 244 may include lanthanum oxide, lanthanum nitride, aluminum oxide, aluminum nitride, titanium oxide, titanium nitride, or titanium aluminum nitride. When n-type devices are intended, the first dipole layer 244 may include lanthanum (such as lanthanum oxide or lanthanum nitride). When p-type devices are intended, the first dipole layer 244 may include aluminum (such as aluminum oxide, aluminum nitride, or titanium aluminum nitride). At block 304, the first dipole layer 244 may be deposited using ALD or PEALD to wrap around each of the channel members 2080 in the third device region D3. To achieve the selective deposition, a patterning film, such as a photoresist layer or a bottom antireflective coating (BARC) layer, may be deposited and patterned to cover the first device region D1 and the second device region D2, while the third device region D3, including the channel members 2080 therein, remains exposed. In some instances, the first dipole layer 244 is deposited to a thickness between about 0.5 Å and about 50 Å.

Figure 13:
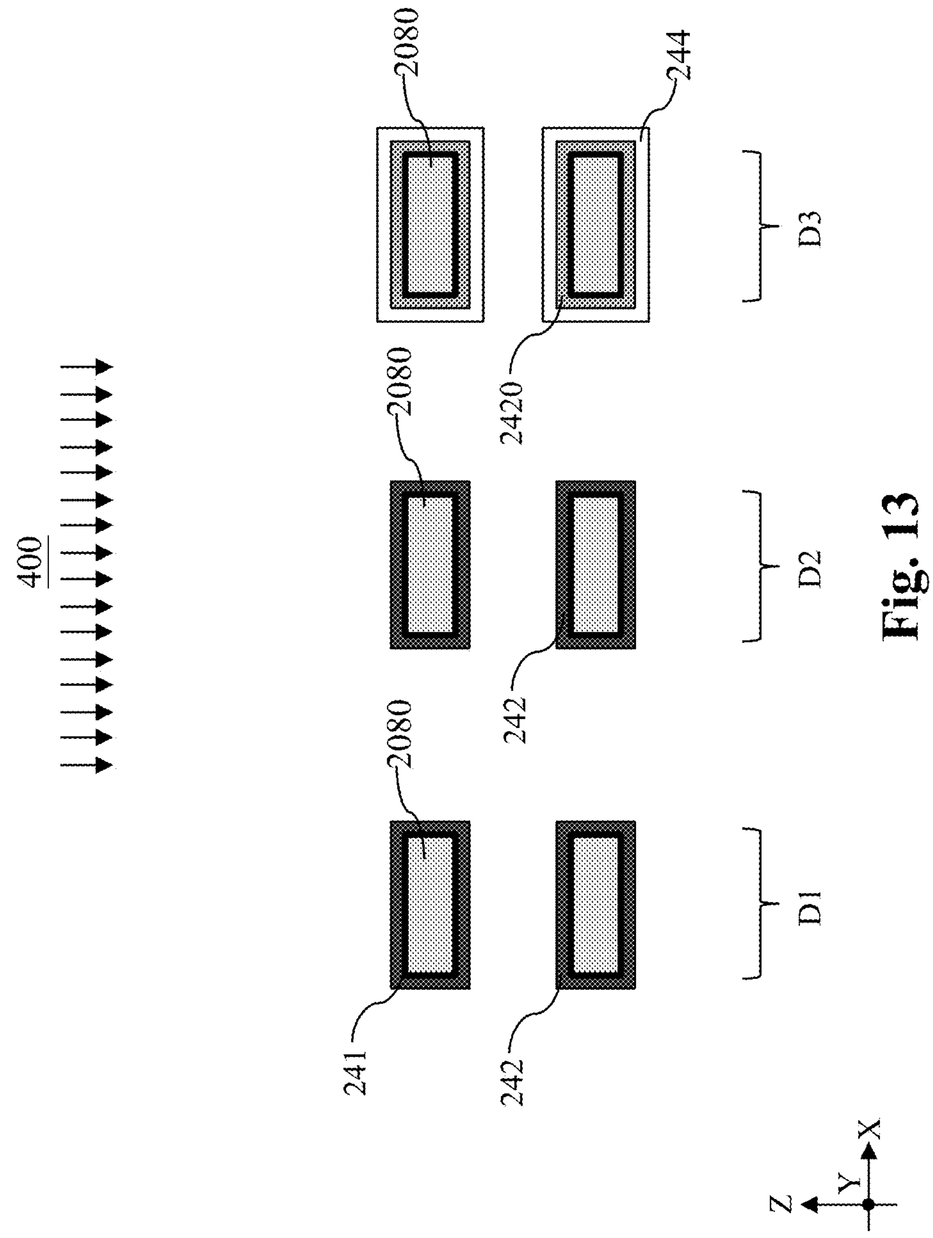

Referring to FIGS. 10 and 13, method 300 includes a block 306 where a first anneal process 400 is performed to drive in dopants in the first dipole layer 244 into the first gate dielectric layer 242. The first anneal process 400 may be soak anneal process or a spike anneal process. In embodiments where the first anneal process 400 is a soak anneal process, the first anneal process 400 includes a temperature between about 400° C. and about 1000° C. and a soak time between about 5 seconds and about 300 seconds. In embodiments where the first anneal process 400 is a spike anneal process, the first anneal process 400 includes a temperature between about 600° C. and about 1000° C. Dopants in the first dipole layer 244 may include an element in the first dipole layer 244, such as lanthanum (La), aluminum (Al), magnesium (Mg), indium (In), gallium (Ga), titanium (Ti), zirconium (Zr), gadolinium (Gd), yttrium (Y), zinc (Zn), or niobium (Nb). When n-type devices are intended, the dopants of interest may include lanthanum (as in lanthanum oxide or lanthanum nitride). When p-type devices are intended, the dopants of interest may include aluminum (as in aluminum oxide, aluminum nitride, or titanium aluminum nitride). For ease of reference, the first gate dielectric layer 242 that include dopants diffusing from the first dipole layer 244 may be referred to as doped first gate dielectric layer 2420. In embodiments where the devices on the bottom wafer 10 are p-type, the bottom source/drain features 220 are p-type and the doped first gate dielectric layer 2420 includes aluminum diffusing from the first dipole layer 244.

Figure 14:
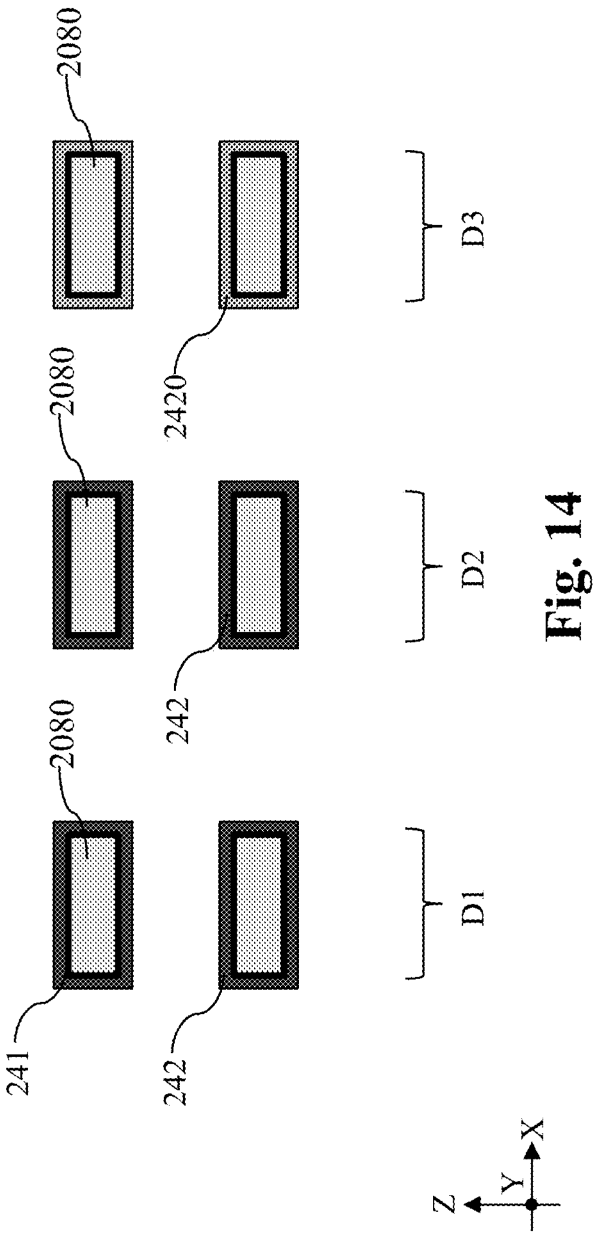

Referring to FIGS. 10 and 14, method 300 includes a block 308 where excess first dipole layer 244 is removed. After the first anneal process 400 at block 306, excess first dipole layer 244 may be removed using a selective wet etch process. For example, the selective wet etch process may include use of hydrofluoric acid, sulfuric acid, hydrogen peroxide, ammonium chloride, ammonium hydroxide, or tetramethylammonium hydroxide (TMAH). The selective wet etch process may etch isotropically to remove the excess first dipole layer 244 around the channel members 2080 in the first device region D1.

Figure 15:
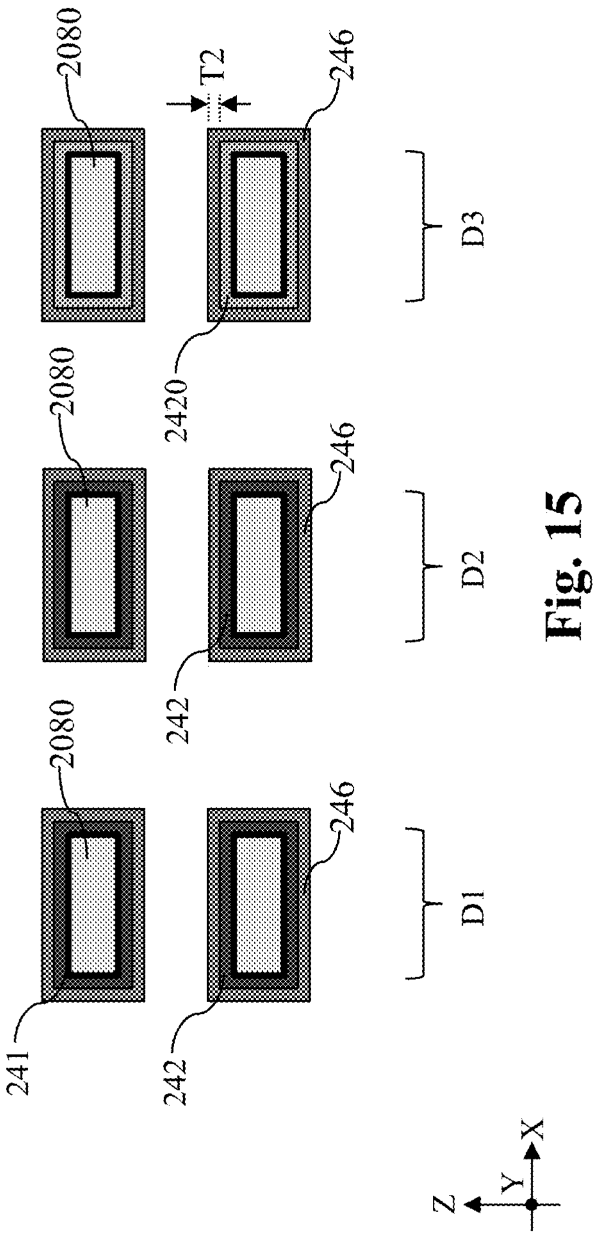

Referring to FIGS. 10 and 15, method 300 includes a block 310 where a second gate dielectric layer 246 is deposited to wrap around each of the channel members 2080 in the first device region D1, the second device region D2 and the third device region D3. The second gate dielectric layer 246 may share the same composition with the first gate dielectric layer 242. In some embodiments, the second gate dielectric layer 246 may include a high dielectric constant (or high-k) dielectric material, such as hafnium oxide, hafnium zirconium oxide, zirconium oxide, or a combination thereof. In one embodiment, the second gate dielectric layer 246 includes hafnium oxide. The second gate dielectric layer 246 may be deposited using ALD or PEALD. As deposited, the second gate dielectric layer 246 may include a second thickness T2 between about 0.5 Å and about 40 Å. Because the second gate dielectric layer 246 is of a supplemental nature, the second thickness T2 is smaller than the first thickness T1.

Figure 16:
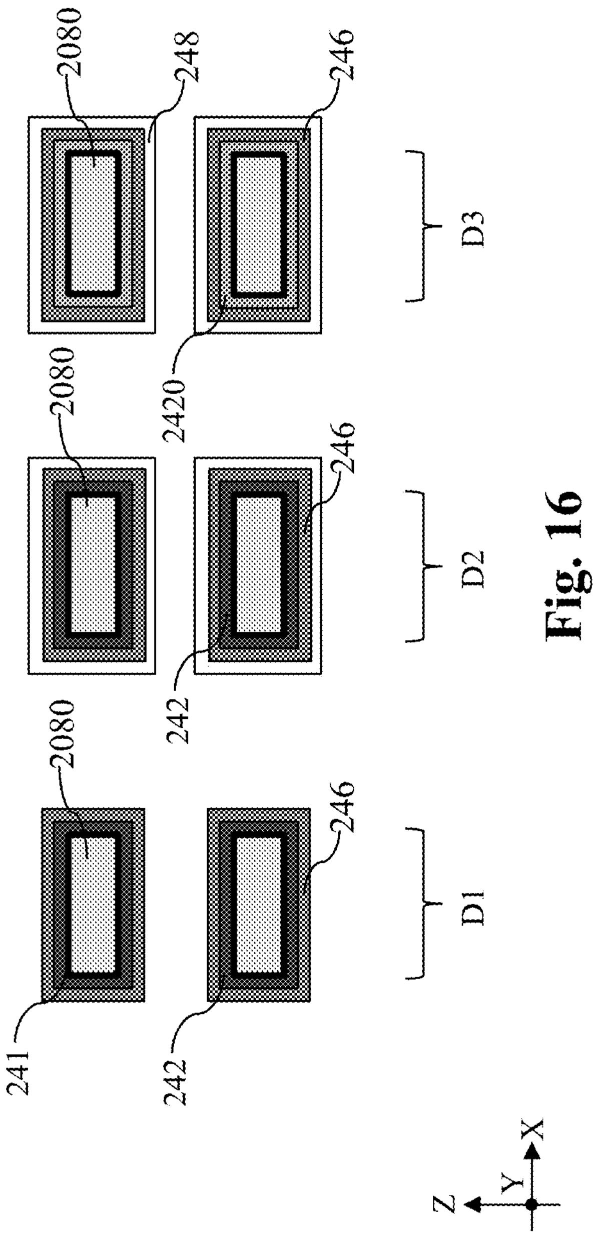

Referring to FIGS. 10 and 16, method 300 includes a block 312 where a second dipole layer 248 is selectively deposited to wrap around each of the channel members 2080 in the second device region D2 and the second device region D3. The second dipole layer 248 may be a metal oxide, a metal nitride, or a metal alloy that includes lanthanum (La), aluminum (Al), magnesium (Mg), indium (In), gallium (Ga), titanium (Ti), zirconium (Zr), gadolinium (Gd), yttrium (Y), zinc (Zn), or niobium (Nb). For example, the second dipole layer 248 may include lanthanum oxide, lanthanum nitride, aluminum oxide, aluminum nitride, titanium oxide, titanium nitride, titanium aluminum nitride. In terms of composition, the second dipole layer 248 may be identical to or different from the first dipole layer 244. When n-type devices are intended, the second dipole layer 248 may include lanthanum (such as lanthanum oxide or lanthanum nitride). When p-type devices are intended, the second dipole layer 248 may include aluminum (such as aluminum oxide, aluminum nitride, or titanium aluminum nitride). At block 310, the second dipole layer 248 may be deposited using ALD or PEALD to wrap around each of the channel members 2080 in the second device region D2 and the third device region D3. To achieve the selective deposition, a patterning film, such as a photoresist layer or a bottom antireflective coating (BARC) layer, may be deposited and patterned to cover the first device region D1, while the second device region D2 and the third device region D3, including the channel members 2080 therein, remain exposed. In some instances, the second dipole layer 248 is deposited to a thickness between about 0.5 Å and about 50 Å.

Figure 17:
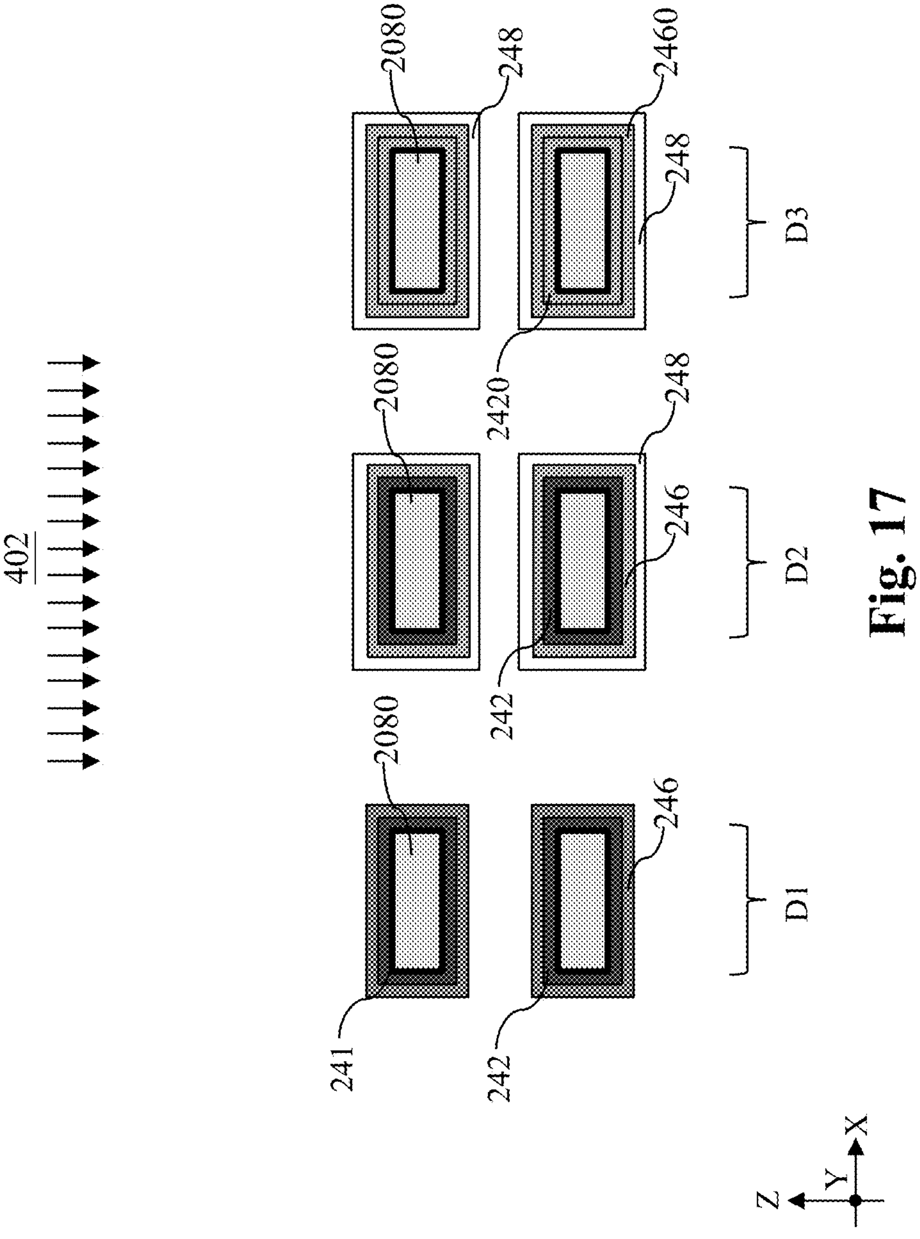

Referring to FIGS. 10 and 17, method 300 includes a block 314 where a second anneal process 402 is performed to drive in dopants in the second dipole layer 248 into the second gate dielectric layer 246. The second anneal process 402 may be soak anneal process or a spike anneal process. In embodiments where the second anneal process 402 is a soak anneal process, the second anneal process 402 includes a temperature between about 400° C. and about 1000° C. and a soak time between about 5 seconds and about 300 seconds. In embodiments where the second anneal process 402 is a spike anneal process, the second anneal process 402 includes a temperature between about 600° C. and about 1000° C. Dopants in the second dipole layer 248 may include an element in the second dipole layer 248, such as lanthanum (La), aluminum (Al), magnesium (Mg), indium (In), gallium (Ga), titanium (Ti), zirconium (Zr), gadolinium (Gd), yttrium (Y), zinc (Zn), or niobium (Nb). When n-type devices are intended, the dopants of interest may include lanthanum (as in lanthanum oxide or lanthanum nitride). When p-type devices are intended, the dopants of interest may include aluminum (as in aluminum oxide, aluminum nitride, or titanium aluminum nitride). For case of reference, the second gate dielectric layer 246 that include dopants diffusing from the second dipole layer 248 may be referred to as doped second gate dielectric layer 2460. In embodiments where the devices on the bottom wafer 10 are p-type, the bottom source/drain features 220 are p-type and the doped second gate dielectric layer 2460 includes aluminum diffusing from the second dipole layer 248.

Figure 18:
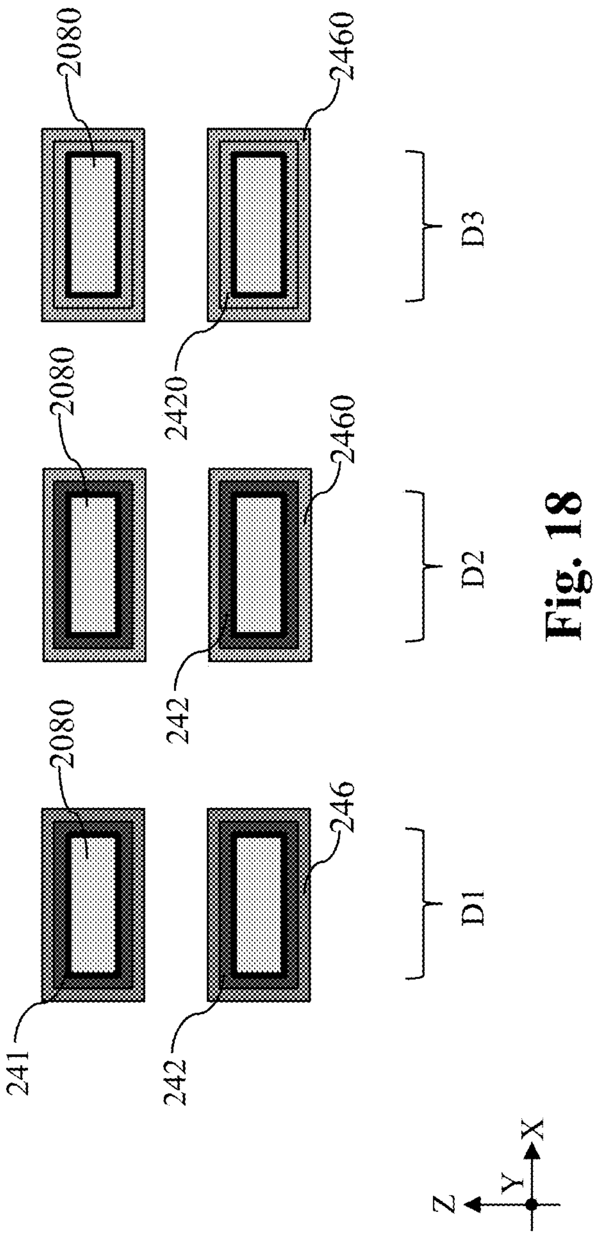

Referring to FIGS. 10 and 18, method 300 includes a block 316 where excess second dipole layer 248 is removed. After the second anneal process 402 at block 314, excess second dipole layer 248 may be removed using a selective wet etch process. For example, the selective wet etch process may include use of hydrofluoric acid, sulfuric acid, hydrogen peroxide, ammonium chloride, ammonium hydroxide, or tetramethylammonium hydroxide (TMAH). The selective wet etch process may etch isotropically to remove the excess second dipole layer 248 around the channel members 2080 in the second device region D2 and the third device region D3.

Figure 19:
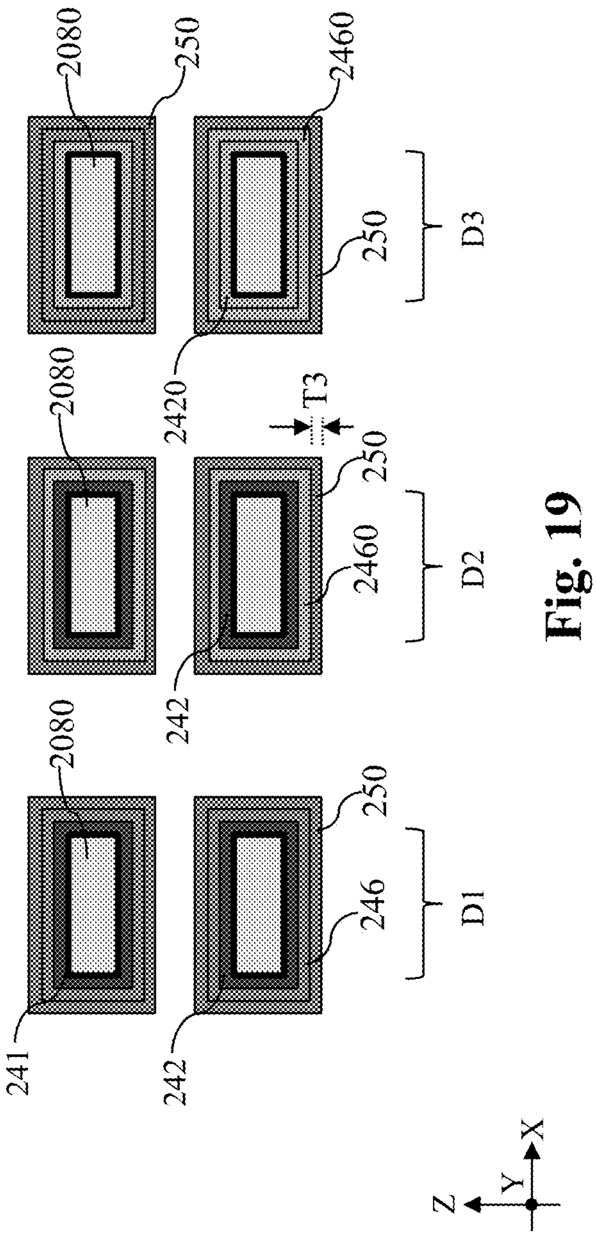

Referring to FIGS. 10 and 19, method 300 includes a block 318 where a third gate dielectric layer 250 to wrap around each of the channel members in the first device region D1, the second device region D2, and the third device region D3. The third gate dielectric layer 250 may share the same composition with the first gate dielectric layer 242. In some embodiments, the third gate dielectric layer 250 may include a high dielectric constant (or high-k) dielectric material, such as hafnium oxide, hafnium zirconium oxide, zirconium oxide, or a combination thereof. In one embodiment, the third gate dielectric layer 250 includes hafnium oxide. The third gate dielectric layer 250 may be deposited using ALD or PEALD. As deposited, the third gate dielectric layer 250 may include a third thickness T3 between about 0.5 Å and about 40 Å. Because the third gate dielectric layer 250 is also of a supplemental nature, the third thickness T3 may be smaller than the second thickness T2. In some embodiments, a total thickness of the gate dielectric layers wrapping around each of the channel members 2080 is between about 5 Å and about 50 Å. This ensures sufficient space for the satisfactory formation of the bottom gate electrode 230B.

Referring to FIGS. 1 and 4, method 100 includes a block 106 where a bottom gate electrode 230B is formed to wrap around each of the bottom channel members 2080B. In some embodiments represented in FIG. 4, the bottom wafer 10 includes p-type devices, the bottom source/drain features 220 are p-type and the bottom gate electrode 230B includes at least one p-type work function layer and a metal cap layer. The at least one p-type work function layer may include titanium nitride (TiN), tantalum nitride (TaN), ruthenium (Ru), molybdenum (Mo), tungsten nitride (WN), zirconium silicide ($ZrSi_2$), molybdenum silicide ($MoSi_2$), tantalum silicide ($TaSi_2$), nickel silicide ($NiSi_2$), other p-type work function material, or combinations thereof. The metal cap layer may include tungsten (W). In some other embodiments not illustrated in the figures, the bottom wafer 10 may include n-type devices and the bottom gate electrode 230B may include at least one n-type work function layer and a metal cap layer. The at least one n-type work function layer may include titanium (Ti), aluminum (Al), silver (Ag), manganese (Mn), zirconium (Zr), titanium aluminum (TiAl), titanium aluminum carbide (TiAlC), tantalum carbide (TaC), tantalum carbonitride (TaCN), tantalum silicide nitride (TaSiN), tantalum aluminum (TaAl), tantalum aluminum carbide (TaAlC), titanium aluminum nitride (TiAlN), other n-type work function material, or combinations thereof. In some embodiments, after excess material is removed using a chemical mechanical polishing (CMP) process, the bottom gate electrode 230B is recessed and a bottom self-aligned capping (SAC) layer 254 is formed over the recessed bottom gate electrode 230B. After another CMP process is performed to remove excess materials, top surfaces of the bottom SAC layer 254 and the gate spacers 212 are coplanar, as shown in FIG. 4. The bottom SAC layer 254 may include silicon nitride, silicon oxynitride, or silicon oxycarbonitride.

Figure 5:
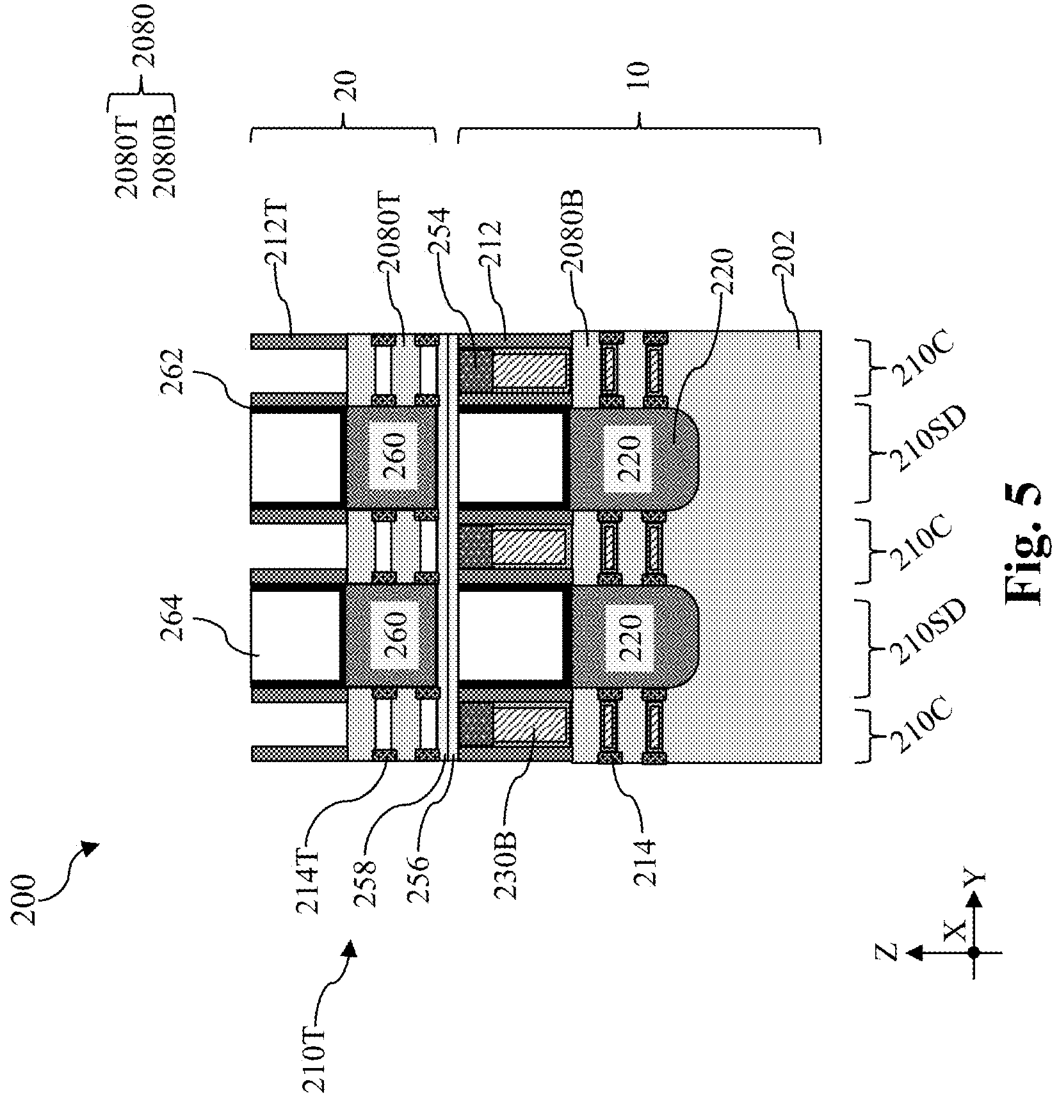
Figure 6:
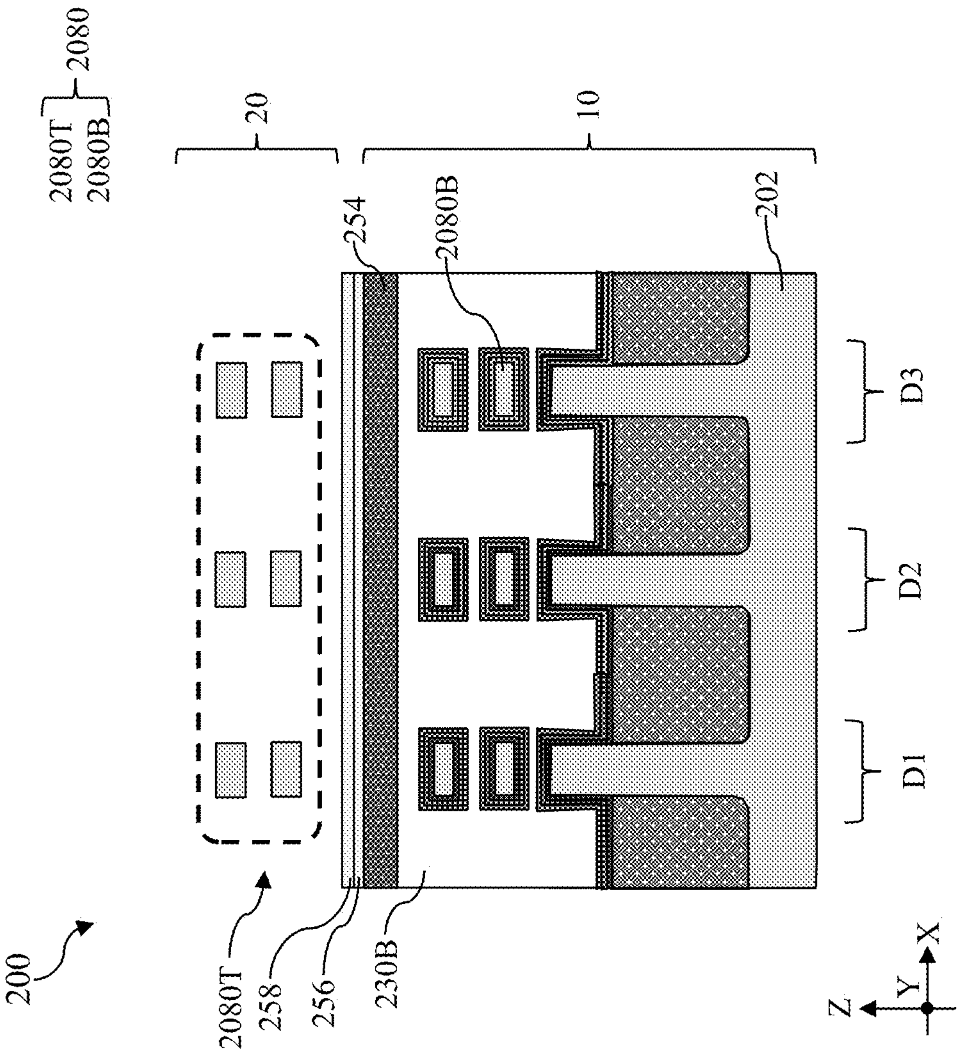

Referring to FIGS. 1, 5 and 6, method 100 includes a block 108 where a top wafer 20 is bonded over the bottom wafer 10. The top wafer 20 includes a plurality of stacks of top channel members 2080T, each extending between two adjacent top source/drain features 260. As shown in FIG. 5, the top wafer 20 includes a top active region 210T. Similar to the active region 210, the top active region 210T may have a fin-like shape and extend lengthwise along the Y direction. Along the Y direction, the top active region 210T also includes a plurality of channel regions 210C interleaved by a plurality of source/drain regions 210SD.

While not explicitly shown in FIG. 5, the top active region 210T is patterned from a stack that includes a plurality of channel layers interleaved by a plurality of sacrificial layers. The stack on the top wafer 20 is disposed on a top substrate, which is removed after the top wafer 20 is bonded to the bottom wafer 10. The channel layers and the sacrificial layers may have different semiconductor compositions. In one embodiment, the channel layers are formed of silicon (Si) and sacrificial layers are formed of silicon germanium (SiGe). In these implementations, the additional germanium content in the sacrificial layers allow selective removal or recess of the sacrificial layers without substantial damages to the channel layers. In FIG. 5, the sacrificial layers over the channel regions 210C have been selectively removed to release the channel layers as top channel members 2080T. Along the Y direction, each of the top channel members 2080T extend between two top source/drain features 260 disposed over source/drain regions 210SD. Before formation of the top source/drain features 260, the source/drain regions 210SD of the top active region 210T are recessed when the channel regions 210C of the top active region 210T are covered by polysilicon dummy gate stacks (removed in FIG. 5) and top gate spacers 212T. The recessing of the source/drain regions 210SD of the top active region 210T form source/drain trenches that expose sidewalls of the channel layers and sacrificial layers. In some embodiments shown in FIG. 5, sidewalls of the sacrificial layers may be selectively recessed to form inner spacer recesses that are later filled with top inner spacer features 214T. As shown in FIG. 5, the top inner spacer features 214 vertically interleave the released top channel members 2080T. As will be shown in FIG. 8, the top inner spacer features 214T function to isolate a top gate electrode 230T and the top source/drain features 260.

Reference is still made to FIG. 5. In some embodiments, the top gate spacers 212T and top inner spacer features 214T may include silicon nitride, silicon oxynitride, silicon carbonitride, silicon oxycarbide, silicon oxycarbonitride, and/or combinations thereof. The top source/drain features 260 may be formed using an epitaxial process, such as vapor phase epitaxy (VPE), ultra-high-vacuum chemical vapor deposition (UHV-CVD), molecular beam epitaxy (MBE), and/or other suitable processes. The epitaxial growth process may use gaseous and/or liquid precursors, which interact with the composition of sidewalls of the top channel members 2080T. The top source/drain features 260 are therefore coupled to sidewalls of the top channel members 2080T. The top source/drain features 260 may be n-type or p-type. When they are n-type, they may include silicon (Si) doped with an n-type dopant, such as phosphorus (P), arsenic (As). When they are p-type, they may include silicon germanium (SiGe) doped with a p-type dopant, such as boron (B). In one embodiment, the top source/drain features 260 are n-type and include phosphorus-doped silicon (Si:P).

As shown in FIG. 5, the top wafer 20 may include a top contact etch stop layer (CESL) 262 disposed along top surfaces of top source/drain features 260 as well as sidewalls of the top gate spacers 212T. A top interlayer dielectric (ILD) layer 264 is deposited over the top CESL 262. The top CESL 262 may include silicon nitride, silicon oxynitride, and/or other materials known in the art and may be formed by ALD, plasma-enhanced chemical vapor deposition (PECVD) process and/or other suitable deposition or oxidation processes. The top ILD layer 264 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. After the formation of the top CESL 262 and the top ILD layer 264, the top wafer 20 is planarized to expose the polysilicon dummy gate stacks on the top wafer 20. The polysilicon dummy gate stacks are then selectively removed. Thereafter, the sacrificial layers are selectively removed to release the channel layers in the top active region 210T as the top channel members 2080T, as illustrated in FIG. 5.

To bond the top wafer 20 on the bottom wafer 10, a first bonding layer 256 is deposited over bottom SAC later 254 and the bottom gate electrode 230B using CVD and a second bonding layer 258 is deposited over a front surface of the top wafer 20. It is noted that, in FIG. 5, the front surface of the top wafer 20 is pointing downward as the top wafer 20 is bonded upside down. In some embodiments, the first bonding layer 256 and the second bonding layer 258 may include silicon oxide or silicon oxynitride. A direct bonding process is performed to bond the second bonding layer 258 to the first bonding layer 256. To ensure a strong bonding between the second bonding layer 258 and the first bonding layer 256, surfaces of the second bonding layer 258 to the first bonding layer 256 are cleaned to remove organic and metallic contaminants. In an example process, a sulfuric acid hydrogen peroxide mixture (SPM), a mixture of ammonium hydroxide and hydrogen peroxide (SC1), or both may be used to remove organic contaminants on the second bonding layer 258 to the first bonding layer 256. A mixture of hydrochloric acid and hydrogen peroxide (SC2) may be used to remove metallic contaminants. The second bonding layer 258 is then brought to direct contact with the first bonding layer 256. An anneal is performed to promote the van der Waals force bonding of the second bonding layer 258 to the first bonding layer 256.

FIG. 6 illustrates a Y-direction fragmentary cross-sectional view that cuts through a channel region 210C. The top wafer 20 disposed directly over the bottom wafer 10 may include multiple device regions. In some embodiments represented in FIG. 6, the top wafer 20 and the bottom wafer 10 share the same three device regions—a first device region D1, a second device region D2, and a third device region D3. For illustration purposes, each of the device regions in FIG. 5 includes a single top active region 210T that includes a vertical stack of top channel members 2080T. However, the present disclosure is not limited. It should be understood that each of the device regions may include more than one top active regions 210T. Additionally, while the first device region D1, the second device region D2 and the third device region D3 are depicted as being disposed next to one another, they may be spaced apart from one another by isolation structures or other devices.

Figure 7:
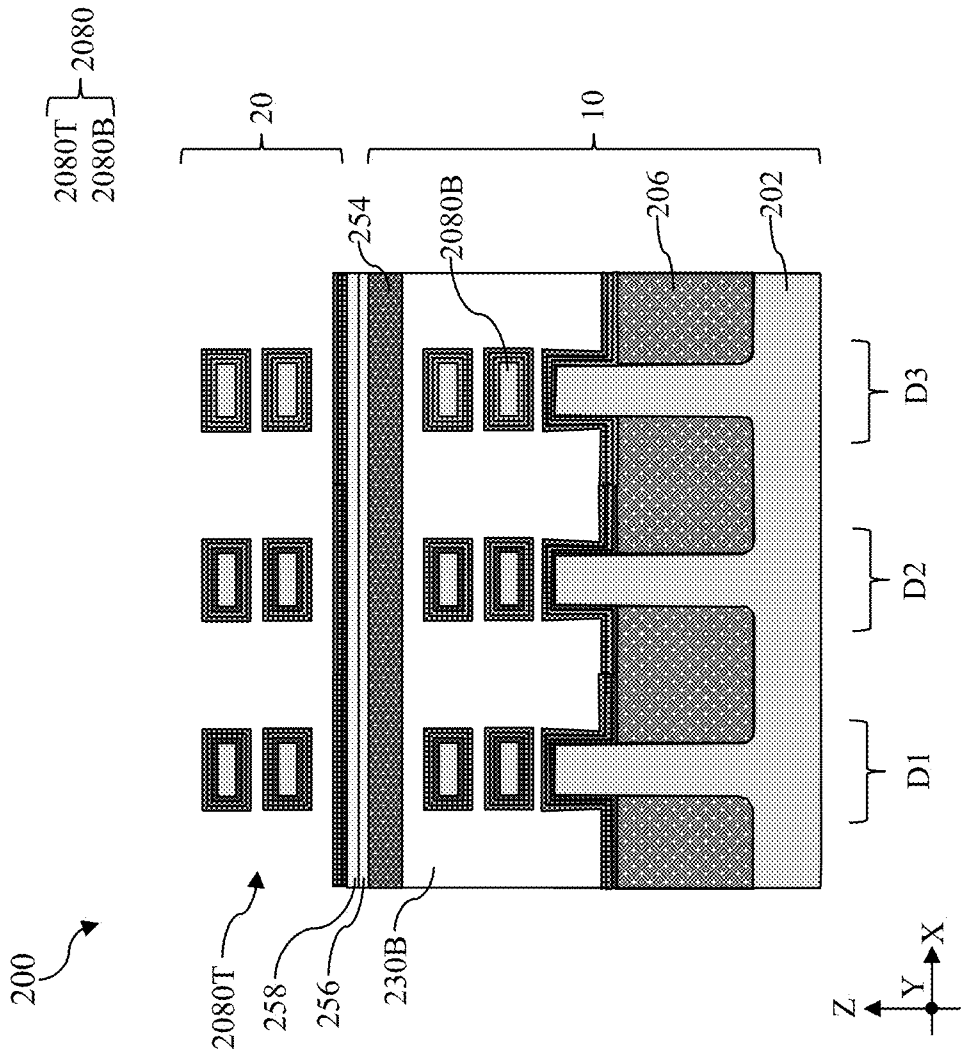

Referring to FIGS. 1 and 7, method 100 includes a block 110 where multiple gate dielectric layers are formed over each of the top channel members 2080T. Because performance of method 300 to the top channel members 2080T largely accounts for the operations at block 110 of method 100, the description again proceeds to method 300.

Referring to FIGS. 10 and 11, method 300 includes a block 302 where a first gate dielectric layer 242 is deposited over each of the channel members 2080 in the first device region D1, each of the channel members 2080 in the second device region D2, and each of the channel members 2080 in the third device region D3. Because method 300 is performed to both the bottom channel members 2080B on the bottom wafer 10 and top channel members 2080T on the top wafer 20, the channel members 2080 shown in FIGS. 11-19 may refer to the bottom channel members 2080B when method 300 is performed at block 104 or top channel members 2080T when method 300 is performed at block 110.

In some embodiments illustrated in FIG. 11, an interfacial layer 241 may be formed on exposed surfaces of the channel members 2080 in the first device region D1, the second device region D2 and the third device region D3. The interfacial layer 241 includes silicon oxide and may be formed in a pre-clean process. An example pre-clean process may include use of RCA SC-1 (ammonia, hydrogen peroxide and water) and/or RCA SC-2 (hydrochloric acid, hydrogen peroxide and water). The first gate dielectric layer 242 may include a high dielectric constant (or high-k) dielectric material, such as hafnium oxide, hafnium zirconium oxide, zirconium oxide, or a combination thereof. In one embodiment, the first gate dielectric layer 242 includes hafnium oxide. The first gate dielectric layer 242 may be deposited using ALD or plasma-enhanced ALD (PEALD). As deposited, the first gate dielectric layer 242 may include a first thickness T1 between about 0.5 Å and about 50 Å. As shown in FIG. 11, the interfacial layer 241 is in direct contact with a top surface, side surfaces and a bottom surfaces of each of the channel members 2080. The first gate dielectric layer 242 is disposed over and in contact with the interfacial layer 241.

Referring to FIGS. 10 and 12, method 300 includes a block 304 where a first dipole layer 244 is selectively deposited to wrap around each of the channel members in the third device region D3. The first dipole layer 244 may be a metal oxide, a metal nitride, or a metal alloy that includes lanthanum (La), aluminum (Al), magnesium (Mg), indium (In), gallium (Ga), titanium (Ti), zirconium (Zr), gadolinium (Gd), yttrium (Y), zinc (Zn), or niobium (Nb). For example, the first dipole layer 244 may include lanthanum oxide, lanthanum nitride, aluminum oxide, aluminum nitride, titanium oxide, titanium nitride, titanium aluminum nitride. When n-type devices are intended, the first dipole layer 244 may include lanthanum (such as lanthanum oxide or lanthanum nitride). When p-type devices are intended, the first dipole layer 244 may include aluminum (such as aluminum oxide, aluminum nitride, or titanium aluminum nitride). At block 304, the first dipole layer 244 may be deposited using ALD or PEALD to wrap around each of the channel members 2080 in the third device region D3. To achieve the selective deposition, a patterning film, such as a photoresist layer or a bottom antireflective coating (BARC) layer, may be deposited and patterned to cover the first device region D1 and the second device region D2, while the third device region D3, including the channel members 2080 therein, remains exposed. In some instances, the first dipole layer 244 is deposited to a thickness between about 0.5 Å and about 50 Å.

Referring to FIGS. 10 and 13, method 300 includes a block 306 where a first anneal process 400 is performed to drive in dopants in the first dipole layer 244 into the first gate dielectric layer 242. The first anneal process 400 may be soak anneal process or a spike anneal process. In embodiments where the first anneal process 400 is a soak anneal process, the first anneal process 400 includes a temperature between about 400° C. and about 1000° C. and a soak time between about 5 seconds and about 300 seconds. In embodiments where the first anneal process 400 is a spike anneal process, the first anneal process 400 includes a temperature between about 600° C. and about 1000° C. Dopants in the first dipole layer 244 may include an element in the first dipole layer 244, such as lanthanum (La), aluminum (Al), magnesium (Mg), indium (In), gallium (Ga), titanium (Ti), zirconium (Zr), gadolinium (Gd), yttrium (Y), zinc (Zn), or niobium (Nb). When n-type devices are intended, the dopants of interest may include lanthanum (as in lanthanum oxide or lanthanum nitride). When p-type devices are intended, the dopants of interest may include aluminum (as in aluminum oxide, aluminum nitride, or titanium aluminum nitride). For ease of reference, the first gate dielectric layer 242 that include dopants diffusing from the first dipole layer 244 may be referred to as doped first gate dielectric layer 2420. In embodiments where the devices on the bottom wafer 10 are p-type, the bottom source/drain features 220 are p-type and the doped first gate dielectric layer 2420 includes aluminum diffusing from the first dipole layer 244.

Referring to FIGS. 10 and 14, method 300 includes a block 308 where excess first dipole layer 244 is removed. After the first anneal process 400 at block 306, excess first dipole layer 244 may be removed using a selective wet etch process. For example, the selective wet etch process may include use of hydrofluoric acid, sulfuric acid, hydrogen peroxide, ammonium chloride, ammonium hydroxide, or tetramethylammonium hydroxide (TMAH). The selective wet etch process may etch isotropically to remove the excess first dipole layer 244 around the channel members 2080 in the first device region D1.

Referring to FIGS. 10 and 15, method 300 includes a block 310 where a second gate dielectric layer 246 is deposited to wrap around each of the channel members 2080 in the first device region D1, the second device region D2 and the third device region D3. The second gate dielectric layer 246 may share the same composition with the first gate dielectric layer 242. In some embodiments, the second gate dielectric layer 246 may include a high dielectric constant (or high-k) dielectric material, such as hafnium oxide, hafnium zirconium oxide, zirconium oxide, or a combination thereof. In one embodiment, the second gate dielectric layer 246 includes hafnium oxide. The second gate dielectric layer 246 may be deposited using ALD or PEALD. As deposited, the second gate dielectric layer 246 may include a second thickness T2 between about 0.5 Å and about 50 Å. Because the second gate dielectric layer 246 is of a supplemental nature, the second thickness T2 is smaller than the first thickness T1.

Referring to FIGS. 10 and 16, method 300 includes a block 312 where a second dipole layer 248 is selectively deposited to wrap around each of the channel members 2080 in the second device region D2 and the second device region D3. The second dipole layer 248 may be a metal oxide, a metal nitride, or a metal alloy that includes lanthanum (La), aluminum (Al), magnesium (Mg), indium (In), gallium (Ga), titanium (Ti), zirconium (Zr), gadolinium (Gd), yttrium (Y), zinc (Zn), or niobium (Nb). For example, the second dipole layer 248 may include lanthanum oxide, lanthanum nitride, aluminum oxide, aluminum nitride, titanium oxide, titanium nitride, titanium aluminum nitride. In terms of composition, the second dipole layer 248 may be identical to or different from the first dipole layer 244. When n-type devices are intended, the second dipole layer 248 may include lanthanum (such as lanthanum oxide or lanthanum nitride). When p-type devices are intended, the second dipole layer 248 may include aluminum (such as aluminum oxide, aluminum nitride, or titanium aluminum nitride). At block 310, the second dipole layer 248 may be deposited using ALD or PEALD to wrap around each of the channel members 2080 in the second device region D2 and the third device region D3. To achieve the selective deposition, a patterning film, such as a photoresist layer or a bottom antireflective coating (BARC) layer, may be deposited and patterned to cover the first device region D1, while the second device region D2 and the third device region D3, including the channel members 2080 therein, remain exposed. In some instances, the second dipole layer 248 is deposited to a thickness between about 0.5 Å and about 50 Å.

Referring to FIGS. 10 and 17, method 300 includes a block 314 where a second anneal process 402 is performed to drive in dopants in the second dipole layer 248 into the second gate dielectric layer 246. The second anneal process 402 may be soak anneal process or a spike anneal process. In embodiments where the second anneal process 402 is a soak anneal process, the second anneal process 402 includes a temperature between about 400° C. and about 1000° C. and a soak time between about 5 seconds and about 300 seconds. In embodiments where the second anneal process 402 is a spike anneal process, the second anneal process 402 includes a temperature between about 600° C. and about 1000° C. Dopants in the second dipole layer 248 may include an element in the second dipole layer 248, such as lanthanum (La), aluminum (Al), magnesium (Mg), indium (In), gallium (Ga), titanium (Ti), zirconium (Zr), gadolinium (Gd), yttrium (Y), zinc (Zn), or niobium (Nb). When n-type devices are intended, the dopants of interest may include lanthanum (as in lanthanum oxide or lanthanum nitride). When p-type devices are intended, the dopants of interest may include aluminum (as in aluminum oxide, aluminum nitride, or titanium aluminum nitride). For ease of reference, the second gate dielectric layer 246 that include dopants diffusing from the second dipole layer 248 may be referred to as doped second gate dielectric layer 2460. In embodiments where the devices on the bottom wafer 10 are p-type, the bottom source/drain features 220 are p-type and the doped second gate dielectric layer 2460 includes aluminum diffusing from the second dipole layer 248.

Referring to FIGS. 10 and 18, method 300 includes a block 316 where excess second dipole layer 248 is removed. After the second anneal process 402 at block 314, excess second dipole layer 248 may be removed using a selective wet etch process. For example, the selective wet etch process may include use of hydrofluoric acid, sulfuric acid, hydrogen peroxide, ammonium chloride, ammonium hydroxide, or tetramethylammonium hydroxide (TMAH). The selective wet etch process may etch isotropically to remove the excess second dipole layer 248 around the channel members 2080 in the second device region D2 and the third device region D3.

Referring to FIGS. 10 and 19, method 300 includes a block 318 where a third gate dielectric layer 250 to wrap around each of the channel members in the first device region D1, the second device region D2, and the third device region D3. The third gate dielectric layer 250 may share the same composition with the first gate dielectric layer 242. In some embodiments, the third gate dielectric layer 250 may include a high dielectric constant (or high-k) dielectric material, such as hafnium oxide, hafnium zirconium oxide, zirconium oxide, or a combination thereof. In one embodiment, the third gate dielectric layer 250 includes hafnium oxide. The third gate dielectric layer 250 may be deposited using ALD or PEALD. As deposited, the third gate dielectric layer 250 may include a third thickness T3 between about 0.5 Å and about 20 Å. Because the third gate dielectric layer 250 is also of a supplemental nature, the third thickness T3 is smaller than the second thickness T2. In some embodiments, a total thickness of the gate dielectric layers wrapping around each of the channel members 2080 is between about 5 Å and about 50 Å. This ensures sufficient space for the satisfactory formation of the top gate electrode 230T.

Figure 8:
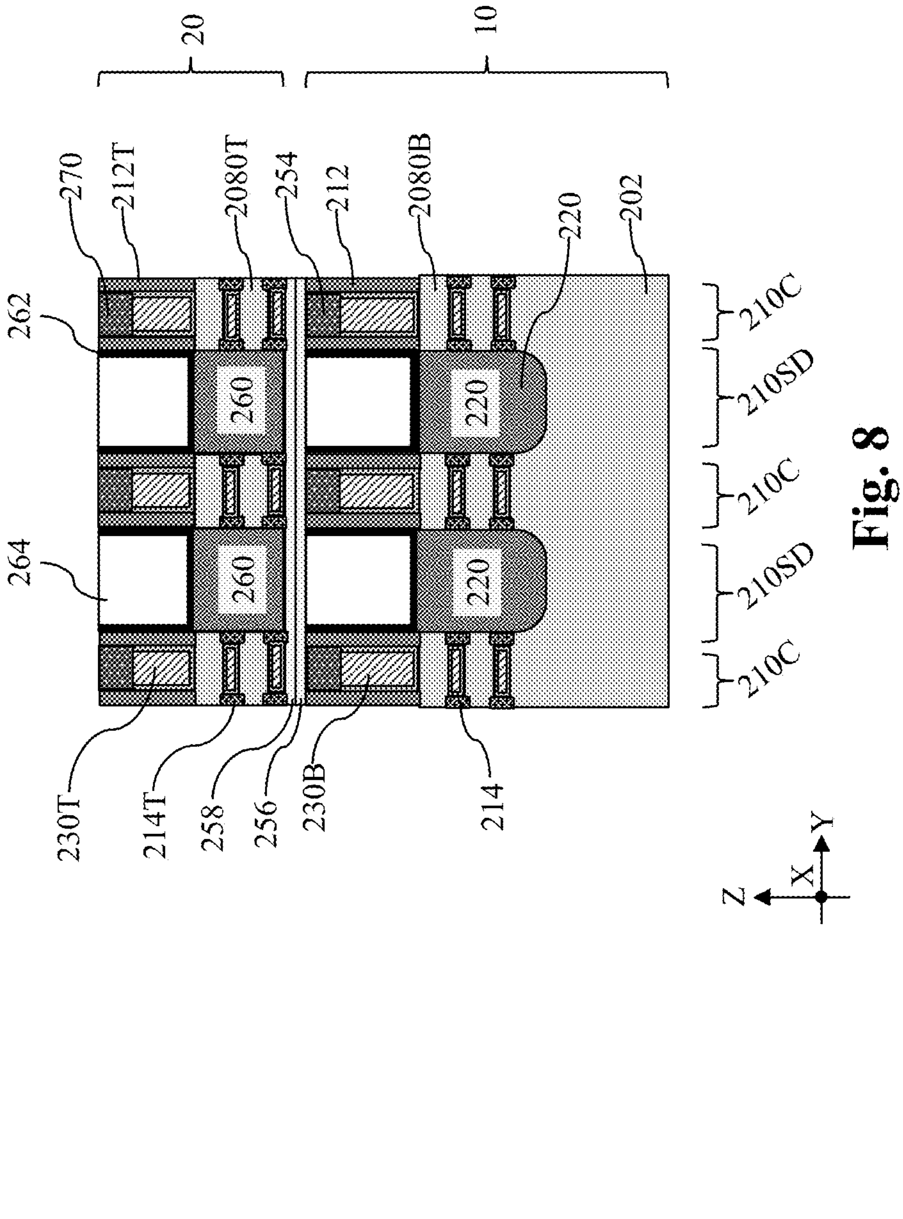

Referring to FIGS. 1 and 8, method 100 includes a block 112 where a top gate electrode 230T is formed to wrap around each of the top channel members 2080T. In some embodiments represented in FIG. 8, the top wafer 20 includes n-type devices, the top source/drain features 260 are n-type and the top gate electrode 230T includes at least one n-type work function layer and a metal cap layer. The at least one n-type work function layer may include titanium (Ti), aluminum (Al), silver (Ag), manganese (Mn), zirconium (Zr), titanium aluminum (TiAl), titanium aluminum carbide (TiAlC), tantalum carbide (TaC), tantalum carbonitride (TaCN), tantalum silicide nitride (TaSiN), tantalum aluminum (TaAl), tantalum aluminum carbide (TaAlC), titanium aluminum nitride (TiAlN), other n-type work function material, or combinations thereof. The metal cap layer may include tungsten (W). In some other embodiments not illustrated in the figures, the top wafer 20 may include p-type devices and the top gate electrode 230T may include at least one p-type work function layer and a metal cap layer. The at least one p-type work function layer may include titanium nitride (TiN), tantalum nitride (TaN), ruthenium (Ru), molybdenum (Mo), tungsten nitride (WN), zirconium silicide ($ZrSi_2$), molybdenum silicide ($MoSi_2$), tantalum silicide ($TaSi_2$), nickel silicide ($NiSi_2$), other p-type work function material, or combinations thereof. In some embodiments, after excess material is removed using a CMP process, the top gate electrode 230T is recessed and a top self-aligned capping (SAC) layer 270 is formed over the recessed top gate electrode 230T. After another CMP process is performed to remove excess materials, top surfaces of the top SAC layer 270 and the top gate spacers 212T are coplanar, as shown in FIG. 8. A composition of the top SAC layer 270 may be similar to that of the bottom SAC layer 254.

Figure 9:
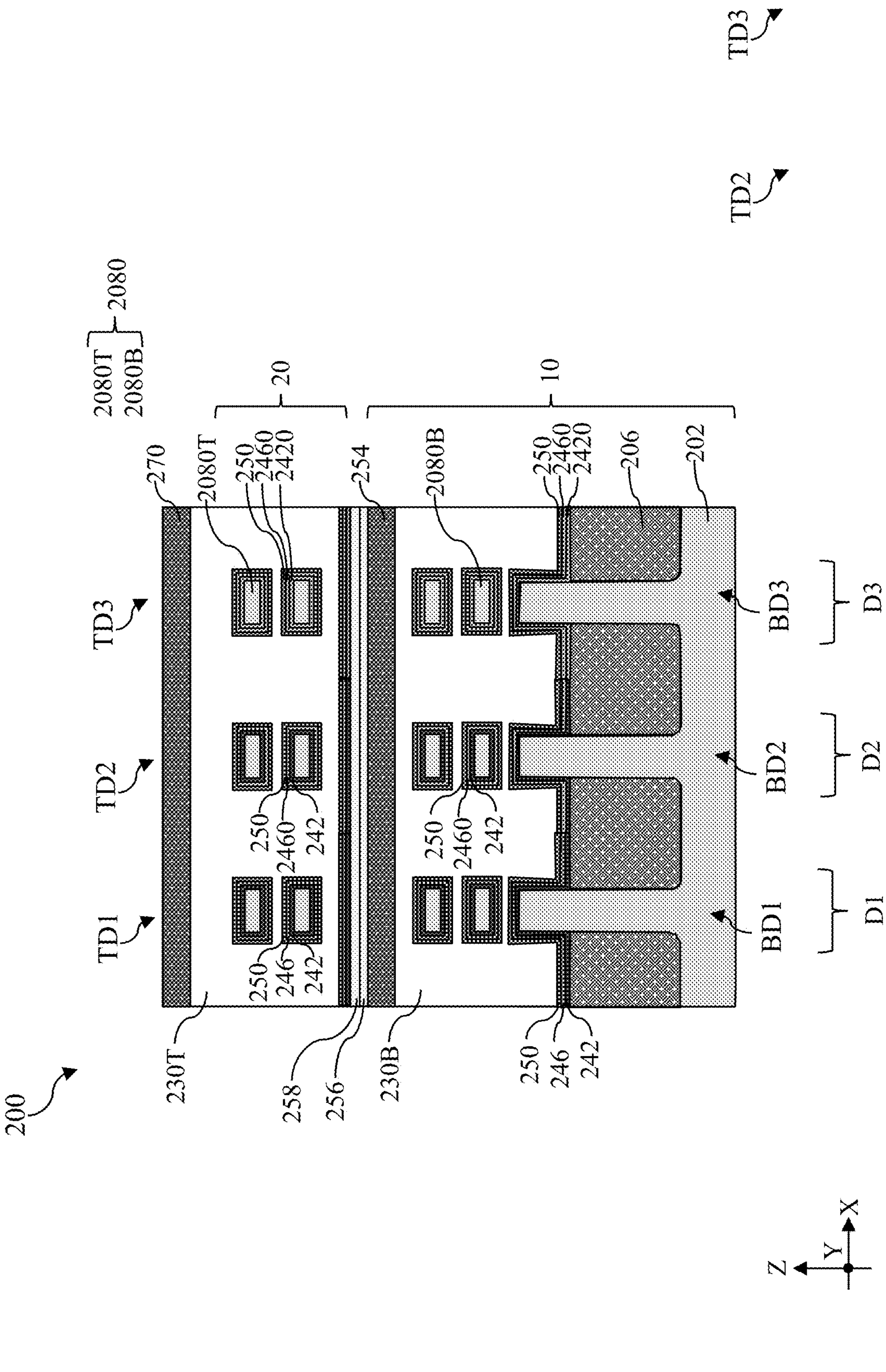

FIG. 9 illustrates a Y-direction fragmentary cross-sectional view that cuts through a channel region 210C in FIG. 8. It can be seen that the threshold voltages of devices in the bottom wafer 10 are determined by the multilayer gate dielectric layer wrapping around the bottom channel members 2080B and the threshold voltages of devices in the top wafer 20 are determined by the multilayer gate dielectric layer wrapping around the top channel members 2080T. This is demonstrated by the fact that bottom channel members 2080B or top channel members 2080T all share the same bottom gate electrode 230B or the same top gate electrode 230T.

For case of illustrations, FIG. 9 show 6 transistors. The bottom wafer 10 of the workpiece 200 includes a first bottom device BD1 in the first device region D1, a second bottom device BD2 in the second device region D2, and a third bottom device BD3 in the third device region D3. The top wafer 20 of the workpiece 200 includes a first top device TD1 in the first device region D1, a second top device TD2 in the second device region D2, and a third top device TD3 in the third device region D3. The first bottom device BD1 is controlled by a gate structure that includes the bottom gate electrode 230B, the first gate dielectric layer 242, the second gate dielectric layer 246, the third gate dielectric layer 250, and the interfacial layer 241. The second bottom device BD2 is controlled by a gate structure that includes the bottom gate electrode 230B, the first gate dielectric layer 242, the doped second gate dielectric layer 2460, the third gate dielectric layer 250, and the interfacial layer 241. The third bottom device BD3 is controlled by a gate structure that includes the bottom gate electrode 230B, the doped first gate dielectric layer 2420, the doped second gate dielectric layer 2460, the third gate dielectric layer 250, and the interfacial layer 241. The first top device TD1 is controlled by a gate structure that includes the top gate electrode 230T, the first gate dielectric layer 242, the second gate dielectric layer 246, the third gate dielectric layer 250, and the interfacial layer 241. The second top device TD2 is controlled by a gate structure that includes the top gate electrode 230T, the first gate dielectric layer 242, the doped second gate dielectric layer 2460, the third gate dielectric layer 250, and the interfacial layer 241. The third top device TD3 is controlled by a gate structure that includes the top gate electrode 230T, the doped first gate dielectric layer 2420, the doped second gate dielectric layer 2460, the third gate dielectric layer 250, and the interfacial layer 241.

In the depicted embodiments, the first bottom device BD1, the second bottom device BD2 and the third bottom device BD3 are all p-type devices. Due to additional dopants in the third region D3 and the second region D2, a threshold voltage of the third bottom device BD3 is lower than that of the second bottom device BD2 and a threshold voltage of the second bottom device BD2 is lower than that of the first bottom device BD1. In the depicted embodiments, the first top device TD1, the second top device TD2 and the third top device TD3 are all n-type devices. Due to additional dopants in the third device region D3 and the second device region D2, a threshold voltage of the third top device TD3 is lower than that of the second top device TD2 and a threshold voltage of the second top device TD2 is lower than that of the first top device TD1. Referring still to FIG. 9, in different device regions, different multilayer gate dielectric layers are also found on top surfaces of the isolation feature 206 in the bottom wafer 10 and on top surfaces of the second bonding layer 258 in the top wafer 20.

In one exemplary aspect, the present disclosure is directed to a method. The method includes receiving a workpiece that includes a substrate, first channel members over a first region of the substrate, second channel members over a second region of the substrate, and third channel members over a third region of the substrate, depositing a first gate dielectric layer to wrap around each of the first channel members, each of the second channel members, and each of the third channel members, selectively depositing a first dipole layer to wrap around each of the third channel members, performing a first anneal process to drive a first dopant in the first dipole layer into the first gate dielectric layer around the third channel members, removing the first dipole layer, and after the removing, depositing a second gate dielectric layer to wrap around each of the first channel members, each of the second channel members, and each of the third channel members.

In some embodiments, the method further includes after the depositing of the second gate dielectric layer, selectively depositing a second dipole layer to wrap around each of the second channel members and each of the third channel members, performing a second anneal process to drive a second dopant in the second dipole layer into the second gate dielectric layer around the second channel members and the third channel members, removing the second dipole layer, and after the removing, depositing a third gate dielectric layer to wrap around each of the first channel members, each of the second channel members, and each of the third channel members. In some embodiments, the first gate dielectric layer, the second gate dielectric layer, and the third gate dielectric layer include hafnium oxide, zirconium oxide, or a mixture thereof. In some implementations, the first dipole layer and the second dipole layer include a metal oxide, a metal nitride, or a metal alloy that includes lanthanum (La), aluminum (Al), magnesium (Mg), indium (In), gallium (Ga), titanium (Ti), zirconium (Zr), gadolinium (Gd), yttrium (Y), zinc (Zn), or niobium (Nb). In some instances, the first dipole layer and the second dipole layer include lanthanum oxide, lanthanum nitride, aluminum oxide, aluminum nitride, titanium oxide, titanium nitride, or titanium aluminum nitride. In some embodiments, the first gate dielectric layer has a first thickness, the second gate dielectric layer has a second thickness, the third gate dielectric layer has a third thickness, and the first thickness, the second thickness and the third thickness are between about 5 Å and about 40 Å. In some embodiments, the first thickness is greater than the second thickness and the second thickness is greater than the third thickness. In some instances, each of the first anneal process and the second anneal process includes a soak anneal and the soak anneal includes a temperature between about 400° C. and about 1000° C. and a soak time between about 5 seconds and about 300 seconds. In some embodiments, each of the first anneal process and the second anneal process includes a spike anneal and the spike anneal includes a temperature between about 600° C. and about 1000° C. In some embodiments, the first dipole layer and the second dipole layer includes a thickness between about 0.5 Å and about 50 Å.

In another exemplary aspect, the present disclosure is directed to a method. The method includes receiving a workpiece that includes a substrate, a first gate structure wrapping around each of first bottom channel members over a first region of the substrate, a second gate structure wrapping around each of second bottom channel members over a second region of the substrate, and a third gate structure wrapping around each of third bottom channel members over a third region of the substrate, forming first top channel members over the first gate structure, second top channel members over the second gate structure, and third top channel members over the third gate structure, depositing a first gate dielectric layer to wrap around each of the first top channel members, each of the second top channel members, and each of the third top channel members, selectively depositing a first dipole layer to wrap around each of the third top channel members, performing a first anneal process to drive a first dopant in the first dipole layer into the first gate dielectric layer around the third top channel members, removing the first dipole layer, and after the removing, depositing a second gate dielectric layer to wrap around each of the first top channel members, each of the second top channel members, and each of the third top channel members.

In some embodiments, the method further includes after the depositing of the second gate dielectric layer, selectively depositing a second dipole layer to wrap around each of the second top channel members and each of the third top channel members, performing a second anneal process to drive a second dopant in the second dipole layer into the second gate dielectric layer around the second top channel members and the third top channel members, removing the second dipole layer, and after the removing, depositing a third gate dielectric layer to wrap around each of the first top channel members, each of the second top channel members, and each of the third top channel members. In some embodiments, the first gate dielectric layer, the second gate dielectric layer, and the third gate dielectric layer include hafnium oxide, zirconium oxide, or a mixture thereof. In some instances, the first dipole layer and the second dipole layer include a metal oxide or a metal nitride that includes La, Al, Mg. In, Ga, Ti, Zr. Gd, Y. Zn, or Nb. In some embodiments, the first gate dielectric layer has a first thickness, the second gate dielectric layer has a second thickness smaller than the first thickness, and the third gate dielectric layer has a third thickness smaller than the second thickness. In some embodiments, each of the first anneal process and the second anneal process includes a soak anneal and the soak anneal includes a temperature between about 400° C. and about 1000° C. and a soak time between about 5 seconds and about 300 seconds. In some embodiments, each of the first anneal process and the second anneal process includes a spike anneal and the spike anneal includes a temperature between about 600° C. and about 1000° C.

In yet another exemplary aspect, the present disclosure is directed to a semiconductor structure. The semiconductor structure includes a substrate that has a first region, a second region, and a third region, first channel members over the first region, second channel members over the second region, third channel members over the third region, a first gate structure wrapping around each of the first channel members and including a first gate dielectric layer in contact with each of the first channel members, a second gate dielectric layer over the first gate dielectric layer, a third gate dielectric layer over the second gate dielectric layer, and a first gate electrode, a second gate structure wrapping around each of the second channel members and including the first gate dielectric layer in contact with each of the second channel members, a fourth gate dielectric layer over the first gate dielectric layer, the third gate dielectric layer over the fourth gate dielectric layer, and a second gate electrode, and a third gate structure wrapping around each of the third channel members and including a fifth gate dielectric layer in contact with each of the third channel members, the fourth gate dielectric layer over the fifth gate dielectric layer, the third gate dielectric layer over the fourth gate dielectric layer, and a third gate electrode. A composition of the first gate dielectric layer is different from a composition of the fourth gate dielectric layer and a composition of the third gate dielectric layer is different from the composition of the fourth gate dielectric layer.

In some embodiments, the first gate electrode, the second gate electrode, and the third gate electrode includes a same composition. In some implementations, a total thickness of the first gate dielectric layer, the second gate dielectric layer and the third gate dielectric layer is between about 5 Å and about 50 Å.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

receiving a workpiece comprising:
- a substrate,
- first channel members over a first region of the substrate,
- second channel members over a second region of the substrate, and
- third channel members over a third region of the substrate;

depositing a first gate dielectric layer to wrap around each of the first channel members, each of the second channel members, and each of the third channel members;

selectively depositing a first dipole layer to wrap around each of the third channel members;

performing a first anneal process to drive a first dopant in the first dipole layer into the first gate dielectric layer around the third channel members;

removing the first dipole layer; and after the removing, depositing a second gate dielectric layer to wrap around each of the first channel members, each of the second channel members, and each of the third channel members.

2. The method of claim 1, further comprising:

after the depositing of the second gate dielectric layer, selectively depositing a second dipole layer to wrap around each of the second channel members and each of the third channel members;

performing a second anneal process to drive a second dopant in the second dipole layer into the second gate dielectric layer around the second channel members and the third channel members;

removing the second dipole layer; and after the removing, depositing a third gate dielectric layer to wrap around each of the first channel members, each of the second channel members, and each of the third channel members.

3. The method of claim 2, wherein the first gate dielectric layer, the second gate dielectric layer, and the third gate dielectric layer comprise hafnium oxide, zirconium oxide, or a mixture thereof.

4. The method of claim 2, wherein the first dipole layer and the second dipole layer comprise a metal oxide, a metal nitride, or a metal alloy that includes lanthanum (La), aluminum (Al), magnesium (Mg), indium (In), gallium (Ga), titanium (Ti), zirconium (Zr), gadolinium (Gd), yttrium (Y), zinc (Zn), or niobium (Nb).

5. The method of claim 2, wherein the first dipole layer and the second dipole layer comprise lanthanum oxide, lanthanum nitride, aluminum oxide, aluminum nitride, titanium oxide, titanium nitride, or titanium aluminum nitride.

6. The method of claim 2,
wherein the first gate dielectric layer has a first thickness,
wherein the second gate dielectric layer has a second thickness,
wherein the third gate dielectric layer has a third thickness,
wherein the first thickness, the second thickness and the third thickness are between about 5 Å and about 40 Å.

7. The method of claim 6,
wherein the first thickness is greater than the second thickness,
wherein the second thickness is greater than the third thickness.

8. The method of claim 2,
wherein each of the first anneal process and the second anneal process comprises a soak anneal,
wherein the soak anneal comprises a temperature between about 400° C. and about 1000° C. and a soak time between about 5 seconds and about 300 seconds.

9. The method of claim 2,
wherein each of the first anneal process and the second anneal process comprises a spike anneal,
wherein the spike anneal comprises a temperature between about 600° C. and about 1000° C.

10. The method of claim 2, wherein the first dipole layer and the second dipole layer comprises a thickness between about 0.5 Å and about 50 Å.

11. A method, comprising:
receiving a workpiece comprising:
a substrate,
a first gate structure wrapping around each of first bottom channel members over a first region of the substrate,
a second gate structure wrapping around each of second bottom channel members over a second region of the substrate, and
a third gate structure wrapping around each of third bottom channel members over a third region of the substrate;
forming first top channel members over the first gate structure, second top channel members over the second gate structure, and third top channel members over the third gate structure;
depositing a first gate dielectric layer to wrap around each of the first top channel members, each of the second top channel members, and each of the third top channel members;
selectively depositing a first dipole layer to wrap around each of the third top channel members;
performing a first anneal process to drive a first dopant in the first dipole layer into the first gate dielectric layer around the third top channel members;
removing the first dipole layer; and
after the removing, depositing a second gate dielectric layer to wrap around each of the first top channel members, each of the second top channel members, and each of the third top channel members.

12. The method of claim 11, further comprising:
after the depositing of the second gate dielectric layer, selectively depositing a second dipole layer to wrap around each of the second top channel members and each of the third top channel members;
performing a second anneal process to drive a second dopant in the second dipole layer into the second gate dielectric layer around the second top channel members and the third top channel members;
removing the second dipole layer; and
after the removing, depositing a third gate dielectric layer to wrap around each of the first top channel members, each of the second top channel members, and each of the third top channel members.

13. The method of claim 12, wherein the first gate dielectric layer, the second gate dielectric layer, and the third gate dielectric layer comprise hafnium oxide, zirconium oxide, or a mixture thereof.

14. The method of claim 12, wherein the first dipole layer and the second dipole layer comprise a metal oxide or a metal nitride comprising La, Al, Mg, In, Ga, Ti, Zr, Gd, Y, Zn, or Nb.

15. The method of claim 12,
wherein the first gate dielectric layer has a first thickness,
wherein the second gate dielectric layer has a second thickness smaller than the first thickness,
wherein the third gate dielectric layer has a third thickness smaller than the second thickness.

16. The method of claim 12,
wherein each of the first anneal process and the second anneal process comprises a soak anneal,
wherein the soak anneal comprises a temperature between about 400° C. and about 1000° C. and a soak time between about 5 seconds and about 300 seconds.

17. The method of claim 12,
wherein each of the first anneal process and the second anneal process comprises a spike anneal,
wherein the spike anneal comprises a temperature between about 600° C. and about 1000° C.

18. A semiconductor structure, comprising:
a substrate comprising a first region, a second region, and a third region;
first channel members over the first region;
second channel members over the second region;
third channel members over the third region;
a first gate structure wrapping around each of the first channel members and comprising:
a first gate dielectric layer in contact with each of the first channel members,
a second gate dielectric layer over the first gate dielectric layer,
a third gate dielectric layer over the second gate dielectric layer, and
a first gate electrode;
a second gate structure wrapping around each of the second channel members and comprising:
the first gate dielectric layer in contact with each of the second channel members,
a fourth gate dielectric layer over the first gate dielectric layer,
the third gate dielectric layer over the fourth gate dielectric layer, and
a second gate electrode; and a third gate structure wrapping around each of the third channel members and comprising:

a fifth gate dielectric layer in contact with each of the third channel members, the fourth gate dielectric layer over the fifth gate dielectric layer, the third gate dielectric layer over the fourth gate dielectric layer, and a third gate electrode, wherein a composition of the first gate dielectric layer is different from a composition of the fourth gate dielectric layer, wherein a composition of the third gate dielectric layer is different from the composition of the fourth gate dielectric layer, wherein the first gate dielectric layer and the fourth gate dielectric layer comprise hafnium oxide, hafnium zirconium oxide, or zirconium oxide.

19. The semiconductor structure of claim 18, wherein the first gate electrode, the second gate electrode, and the third gate electrode comprise a same composition and are continuous over the first channel members, the second channel members, and the third channel members.

20. The semiconductor structure of claim 18, wherein a total thickness of the first gate dielectric layer, the second gate dielectric layer and the third gate dielectric layer is between about 5 Å and about 50 Å.

* * * * *